(12) United States Patent
Chen et al.

(10) Patent No.: US 11,735,536 B2
(45) Date of Patent: *Aug. 22, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW); Sen-Bor Jan, Tainan (TW); Chih-Chia Hu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 51 days.

This patent is subject to a terminal disclaimer.

(21) Appl. No.: 17/406,103

(22) Filed: Aug. 19, 2021

(65) Prior Publication Data
US 2021/0384147 A1    Dec. 9, 2021

Related U.S. Application Data

(63) Continuation of application No. 16/655,244, filed on Oct. 17, 2019, now Pat. No. 11,107,779.

(51) Int. Cl.
*H01L 23/64* (2006.01)
*H01L 23/00* (2006.01)
*H01L 23/48* (2006.01)
*H01L 21/768* (2006.01)

(52) U.S. Cl.
CPC ...... *H01L 23/645* (2013.01); *H01L 21/76879* (2013.01); *H01L 23/481* (2013.01); *H01L 24/09* (2013.01)

(58) Field of Classification Search
CPC ............. H01L 23/645; H01L 23/481; H01L 21/76879; H01L 24/09
See application file for complete search history.

(56) References Cited

U.S. PATENT DOCUMENTS 11,107,779 B2 * 8/2021 Chen ................. H01L 25/50

* cited by examiner

*Primary Examiner* — Jose R Diaz
(74) *Attorney, Agent, or Firm* — JCIPRNET

(57) ABSTRACT

A semiconductor package includes a first die and a second die. The first die includes a first coil and a second coil of an inductor. The first coil and the second coil are located at different level heights. The first coil includes a first metallic material. The second coil includes a second metallic material. The first metallic material has a different composition from the second metallic material. The second die is bonded to the first die. The second die includes a third coil of the inductor. The inductor extends from the first die to the second die.

20 Claims, 26 Drawing Sheets

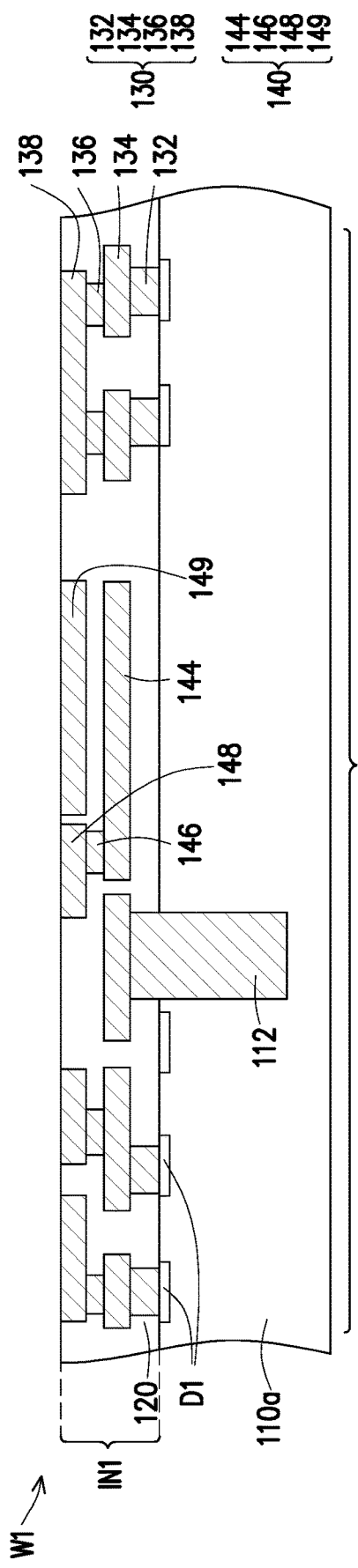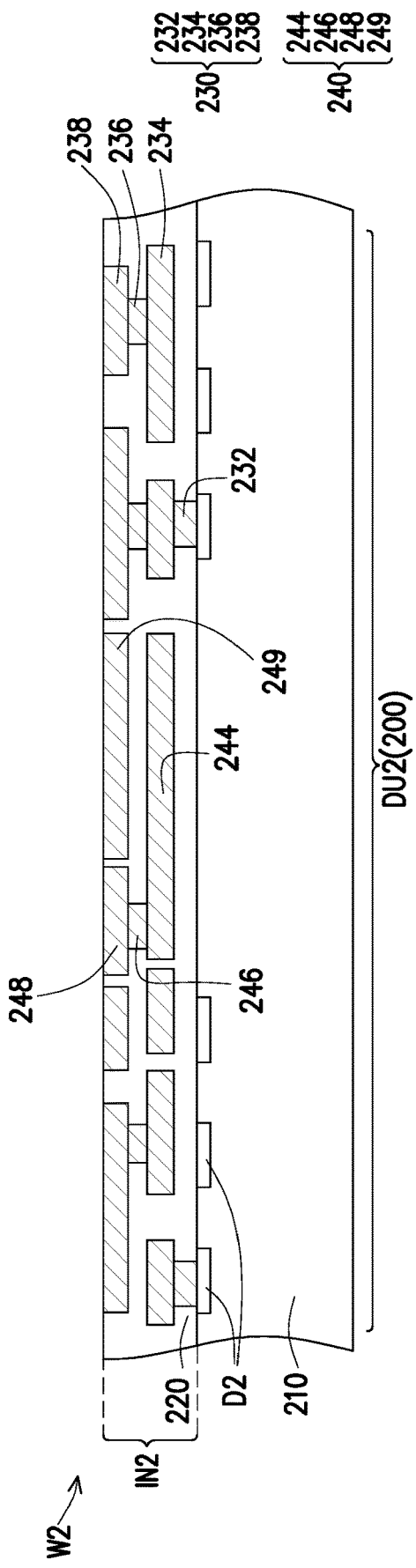
FIG. 1A
FIG. 2A

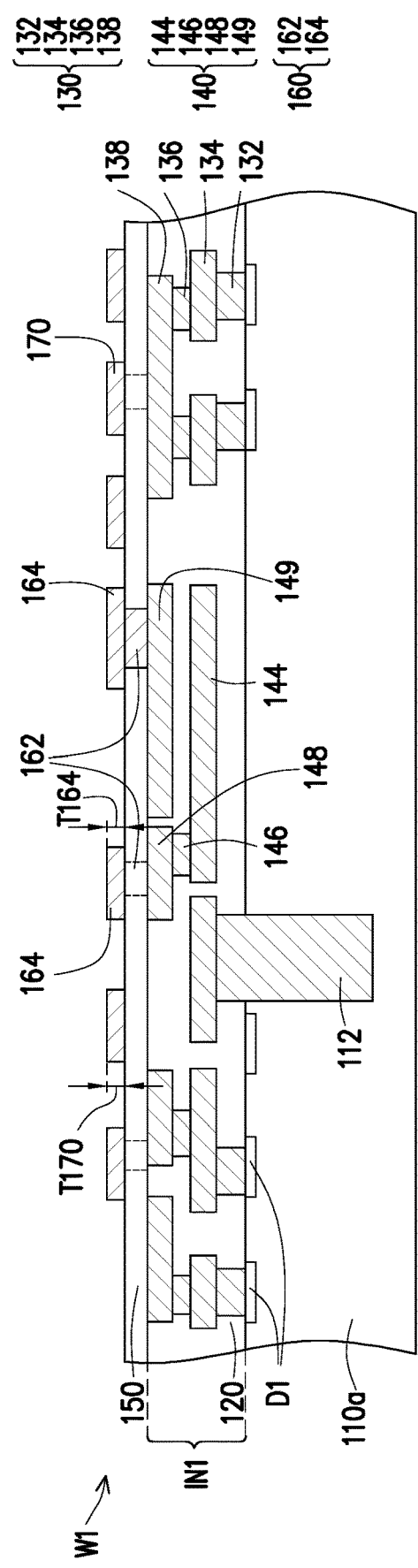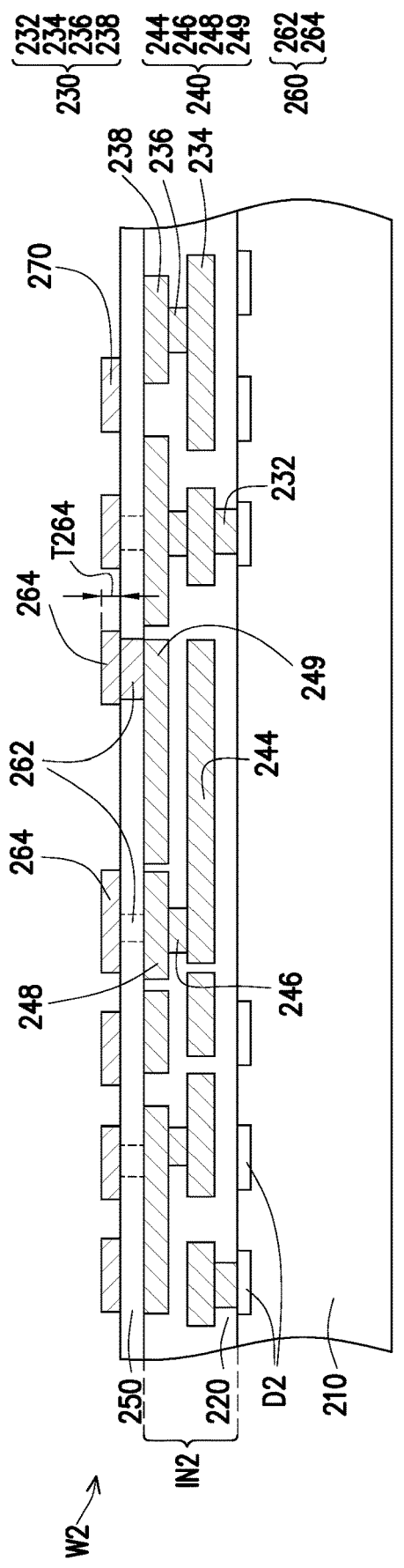

SEMICONDUCTOR PACKAGE AND MANUFACTURING METHOD THEREOF

CROSS-REFERENCE TO RELATED APPLICATION

This application is a continuation application of and claims the priority benefit of a prior application Ser. No. 16/655,244, filed on Oct. 17, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1F are schematic cross-sectional views illustrating a manufacturing process of a semiconductor die in accordance with some embodiments of the disclosure.

FIG. 2A to FIG. 2F are schematic cross-sectional views illustrating a manufacturing process of another semiconductor die in accordance with some embodiments of the disclosure.

DETAILED DESCRIPTION

Figure 1B:
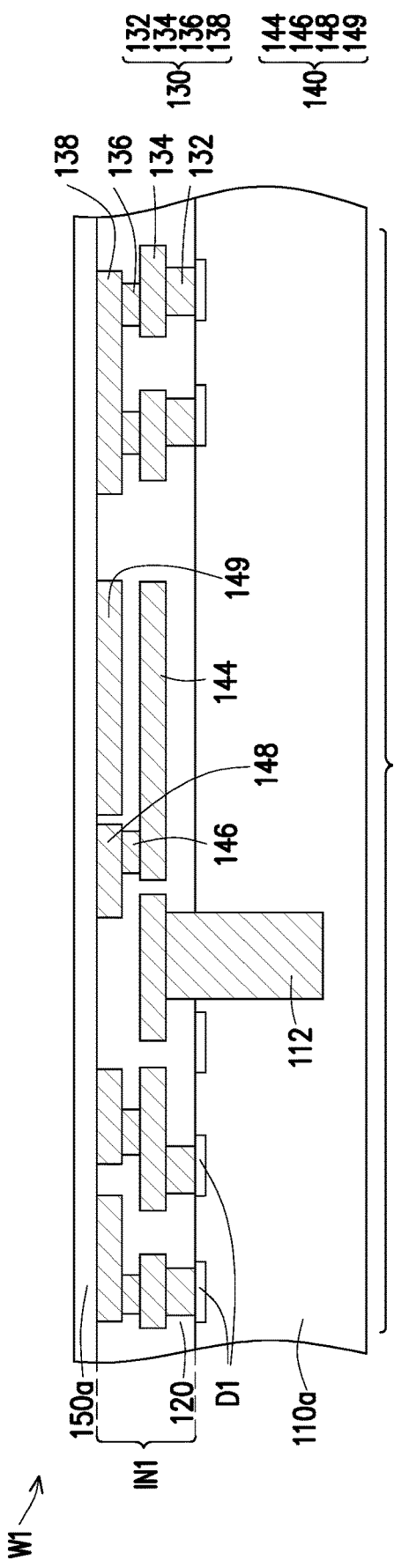

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2B:
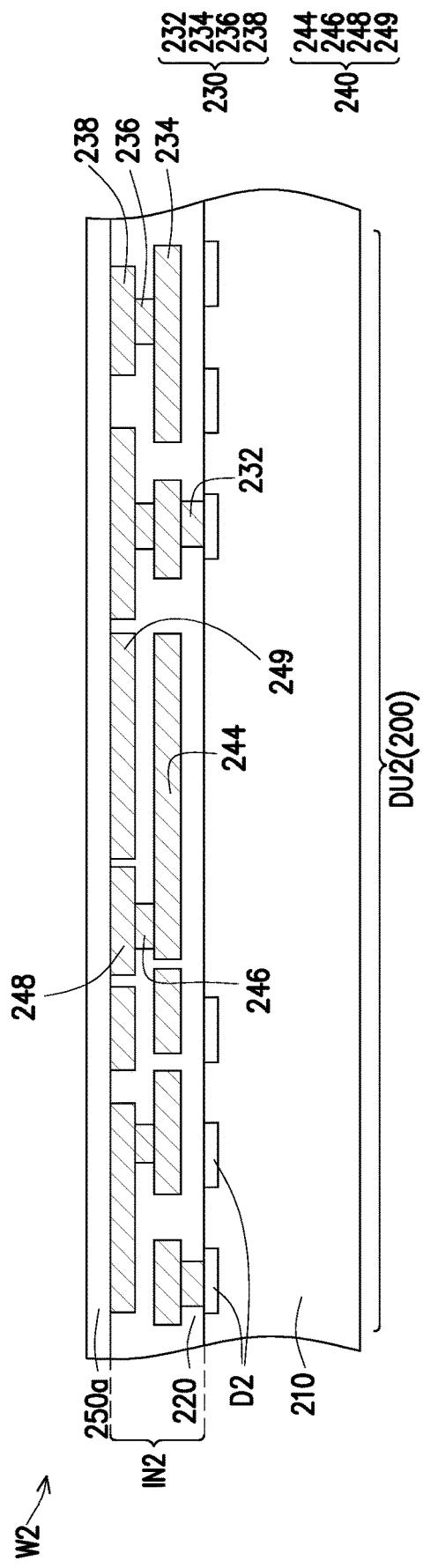

FIG. 1A to FIG. 1F and FIG. 2A to FIG. 2F are schematic cross-sectional views illustrating manufacturing processes of semiconductor dies 100 and 200 in accordance with some embodiments of the disclosure. Referring to FIG. 1A and FIG. 2A, semiconductor wafers W1 and W2 are provided. In some embodiments, the semiconductor wafer W1 includes a plurality of die units DU1 and the semiconductor wafer W2 includes a plurality of die units DU2. In some embodiments, the die unit DU1 corresponds to a portion of the semiconductor wafer W1 and the die unit DU2 corresponds to a portion of the semiconductor wafer W2. For simplicity, one die unit DU1 is shown in FIG. 1A and one die unit DU2 is shown in FIG. 2A. However, it is understood that multiple die units DU1 and DU2 may be arranged in an array in the corresponding semiconductor wafers W1 and W2.

In some embodiments, each die unit DU1 includes a semiconductor substrate 110a and an interconnection structure IN1 disposed on the semiconductor substrate 110a. In some embodiments, the semiconductor substrate 110a may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. In some embodiments, the semiconductor substrate 110a has devices D1 formed therein. The devices D1 may include active components (e.g., transistors or the like) and/or passive components (e.g., resistors, capacitors, inductors, or the like). The semiconductor substrate 110a may further include through semiconductor vias (TSVs) 112. In some embodiments, the TSVs 112 would penetrate through the semiconductor substrate 110a for dual-side connection after processing (shown in FIG. 3D). In some alternative embodiments, the TSVs 112 are optional and may be omitted. As illustrated in FIG. 1A, a first end of a TSV 112 is embedded in the interconnection structure IN1 and a second end of the TSV 112 is embedded in the semiconductor substrate 110a. That is, the TSV 112 extends from the interconnection structure IN1 to the semiconductor substrate 110a. It is understood that one TSV 112 is shown in FIG. 1A for exemplary illustration, and the disclosure is not limited thereto. In some embodiments, the die unit DU1 may include fewer or more TSVs 112.

In some embodiments, the interconnection structure IN1 includes an inter-dielectric layer 120, interconnection conductive patterns 130 and inductor patterns 140. In some embodiments, the interconnection conductive patterns 130 and the inductor patterns 140 are embedded in the inter-dielectric layer 120. For simplicity, the inter-dielectric layer 120 is illustrated as one single dielectric layer and the interconnection conductive patterns 130 and the inductor patterns 140 are illustrated as embedded in the single inter-dielectric layer 120 in FIG. 1A. Nevertheless, from the perspective of the manufacturing process, the inter-dielectric layer 120 may be constituted by multiple stacked dielectric layers, with the interconnection conductive patterns 130 and the inductor patterns 140 being sandwiched between two adjacent inter-dielectric layers 120.

In some embodiments, the interconnection conductive patterns 130 include trench portions 134, 138 and via portions 132, 136. In some embodiments, the via portions 132, 136 extend vertically through the inter-dielectric layer 120 to establish electrical connection with the underlying trench portions 134 or the underlying devices D1. For example, the via portions 132 may establish electrical connection between the devices D1 in the semiconductor substrate 110 and the overlaying trench portions 134, while the via portions 136 may establish electrical connection between the trench portions 134 and the trench portions 138. In some embodiments, the TSV 112 is in direct contact with one of the trench portions 134.

In some embodiments, the inductor patterns 140 include trench portions 144, 148, 149 and a via portion 146. In some embodiments, the trench portions 144 may be substantially coplanar with the trench portions 134. Similarly, the trench portions 148, the trench portions 149, and the trench portions 138 are substantially coplanar with each other. In other words, the trench portions 144 and the trench portions 134 may be formed at the same time by the same process step. Similarly, the trench portions 148, the trench portions 149, and the trench portions 138 may also be formed at the same time by the same process step.

In some embodiments, the trench portions 134, 138, 144, 148, 149 and the via portions 132, 136, 146 may be referred to as a metallization layers. For example, the trench portions 134, 144 and the via portions 132 may be referred to as a first metallization layer of the interconnection structure IN1. Similarly, the trench portions 138, 148, 149 and the via portions 146 may be referred to as a second metallization layer. It should be noted that while the interconnection structure IN1 is illustrated in FIG. 1A as including only two metallization layers, the disclosure is not limited thereto. In some embodiments, more or fewer metallization layers may be included. In some alternative embodiments, the number of interconnection conductive patterns 130, the number of the inductor patterns 140, and the number of the inter-dielectric layers 120 may be adjusted depending on the routing requirements.

In some embodiments, a material of the inter-dielectric layer 120 includes polyimide, epoxy resin, acrylic resin, phenol resin, benzocyclobutene (BCB), polybenzoxazole (PBO), combinations thereof, or other suitable dielectric materials. The inter-dielectric layer 120 may be formed by suitable fabrication techniques such as spin-on coating, lamination, chemical vapor deposition (CVD), or the like. In some embodiments, the interconnection conductive patterns 130 and the inductor patterns 140 include the same materials. In some embodiments, the material of the interconnection conductive patterns 130 and the inductor patterns 140 includes aluminum, titanium, copper, nickel, tungsten, and/or alloys thereof. In some embodiments, the interconnection conductive patterns 130 and the inductor patterns 140 are formed simultaneously. For example, the interconnection conductive patterns 130 and the inductor patterns 140 may be formed by electroplating, deposition, and/or photolithography and etching. In some embodiments, the conductive patterns 130 and the inductor patterns 140 may be formed according to a damascene or dual damascene process.

Referring to FIG. 2A, the die units DU2 in the semiconductor wafer W2 may be similar to the die units DU1 in the semiconductor wafer W1, so the detailed description thereof is omitted herein. In some embodiments, each die unit DU2 includes a semiconductor substrate 210 having devices D2 formed therein and an interconnection structure IN2 formed thereon. The interconnection structure IN2 includes an inter-dielectric layer 220 having interconnection conductive patterns 230 and inductor patterns 240 embedded therein. In some embodiments, the interconnection conductive patterns 230 includes via portions 232, 236 and trench portions 234 and 238. In some embodiments, the inductor patterns 240 include trench portions 244, 248, 249 and a via portion 246. As illustrated in FIG. 2A, the die unit DU2 is free of TSV, but the disclosure is not limited thereto. In some alternative embodiments, the semiconductor substrate 210 may include TSVs having similar configurations as the TSV 112 in the first die unit DU1 of FIG. 1A.

For simplicity, the process performed on the semiconductor wafer W1 and the process performed on the semiconductor wafer W2 will be described simultaneously below. It should be noted that this does not imply that the disclosure is limited to the cases in which the two semiconductor wafers W1 and W2 are processed simultaneously, nor to the cases in which the same materials or the same patterns have to be used or formed for similar or corresponding parts between the semiconductor wafers W1 and W2. For example, in some embodiments the interconnection conductive patterns 130 of the semiconductor wafer W1 may include different materials as compared to that of the interconnection conductive patterns 230 of the semiconductor wafer W2. As a further example, the routing configurations of the interconnection conductive patterns 230 or the inductor patterns 240 of the semiconductor wafer W2 may differ from the routing configurations of the interconnection conductive patterns 130 or the inductor patterns 140 of the semiconductor wafer W1.

Referring to FIG. 1B and FIG. 2B, a protective material layer 150a is formed on the interconnection structure IN1 and a protective material layer 250a is formed on the interconnection structure IN2. In some embodiments, the protective material layer 150a and the protective material layer 250a cover the corresponding underlying interconnection structures IN1 and IN2. In some embodiments, the protective material layers 150a, 250a may independently include polyimide, epoxy resin, acrylic resin, phenol resin, benzocyclobutene (BCB), polybenzoxazole (PBO), or any other suitable dielectric material. In some embodiments, the protective material layers 150a, 250a include inorganic materials. The inorganic materials may be oxides, such as silicon oxide; nitrides, such as silicon nitrides; or the like. The protective material layers 150a, 250a may be formed by suitable fabrication techniques such as spin-on coating, CVD, or the like. In some embodiments, the interconnection structure IN1 is sandwiched between the protective material layer 150a and the semiconductor substrate 110a, and the interconnection structure IN2 is sandwiched between the protective material layer 250a and the semiconductor substrate 210.

Referring to FIG. 1C and FIG. 2C, the protective material layers 150a, 250a are patterned to form protective layers 150, 250. In some embodiments, the protective layer 150 has a plurality of openings exposing the trench portions 138, 148, and 149. Similarly, the protective layer 250 has a plurality of openings exposing the trench portions 238, 248, and 249. Thereafter, a conductive material may be filled into the openings and over the protective layers 150, 250 by electroplating, deposition, and/or photolithography and etching to form inductor patterns 160, 260 and conductive pads 170, 270. In some embodiments, the inductor patterns 160 are formed over and are electrically connected to the inductor patterns 140. The inductor patterns 160 may include via portions 162 extending through the protective layer 150 and trench portions 164 disposed on the protective layers 150. The via portions 162 electrically connect the trench portions 164 to the trench portions 148, 149 of the inductor patterns 140. In some embodiments, the inductor patterns 140 and 160 are collectively referred to as a first spiral section of an inductor IND1 (shown in FIG. 3A).

In some embodiments, the conductive pads 170 are formed on the protective layer 150 over the interconnection conductive patterns 130. In some embodiments, each conductive pads 170 may have a protrusion (via) penetrating through the protective layer 150 to establish electrical connection with the interconnection conductive patterns 130. In some embodiments, the conductive pads 170 are used to establish electrical connection with other electronic components (not shown) formed subsequently. In some alternative embodiments, the conductive pads 170 may be test pads used to probe the die units DU1. In some embodiments, a thickness T164 of the trench portions 164 of the inductor patterns 160 is in the range from 0.6 μm to 2.8 μm. In some embodiments, the thickness T164 of the trench portions 164 is the same as a thickness T170 of the conductive pads 170. Herein, the thickness T170 of the conductive pads 170 refers to the thickness of the conductive pads 170 located above the protective layer 150. That is, the thickness T170 excludes the thickness of the protrusion of the conductive pads 170.

Similar to the inductor patterns 160, the inductor patterns 260 include trench portions 264 disposed on the protective layer 250 and via portions 262 extending through the protective layer 250 to establish electrical connection with the underlying inductor patterns 240. In some embodiments, the inductor patterns 240 and 260 are collectively referred as a second spiral section of the inductor IND1 (shown in FIG. 3A). In some embodiments, the conductive pads 270 are formed on the protective layer 250 and may have protrusions (vias) penetrating through the protective layer 250 to establish electrical connection with the underlying interconnection conductive patterns 230. A thickness T164 of the trench portions 164 may be the same as or different from the thickness T264 of the trench portions 264. In some embodiments, a ratio of the thickness T164 to the thickness T264 is in the range from 0.5 to 5.

In some embodiments, a material of the inductor patterns 160, 260 and the conductive pads 170, 270 may include aluminum, titanium, copper, nickel, tungsten, alloys thereof, or other suitable materials. In some embodiments, the material of the inductor patterns 160 is different from the material of the underlying inductor patterns 140, the material of the conductive pads 170 is different from the material of the underlying interconnection patterns 130, the material of the inductor patterns 260 is different from the material of the underlying inductor patterns 240, and the material of the conductive pads 270 is different from the material of the underlying interconnection patterns 230. In some embodiments, the inductor patterns 160, 260 may be formed simultaneously with the corresponding conductive pads 170, 270. That is, the material of the inductor patterns 160, 260 and the material of the conductive pads 170, 270 may be identical.

Figure 1D:
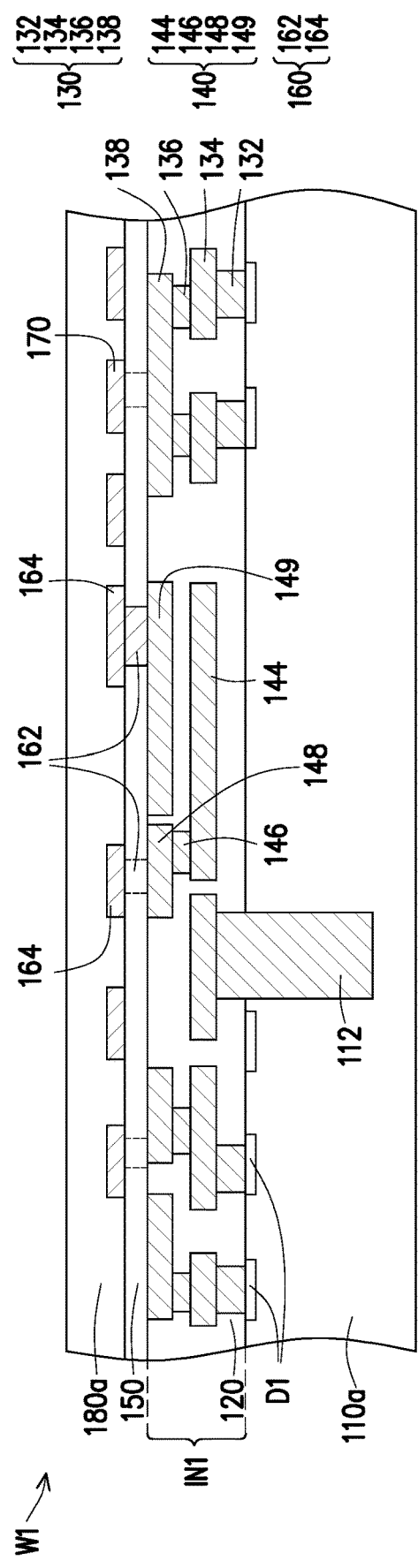
Figure 2D:
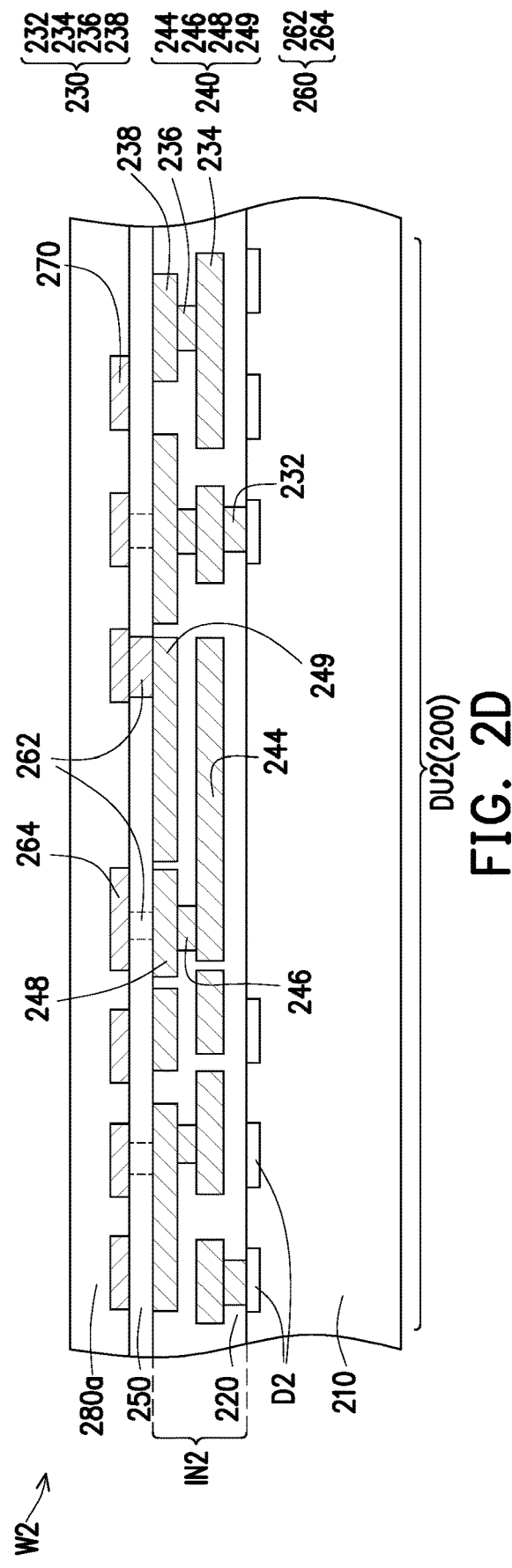

Referring to FIG. 1D and FIG. 2D, bonding dielectric material layers 180a and 280a are respectively formed on the protective layers 150 and 250 to cover the corresponding inductor patterns 160, 260 and conductive pads 170, 270. In some embodiments, a material of the bonding dielectric material layers 180a, 280a includes oxides such as silicon dioxide, polyimide, epoxy resin, acrylic resin, phenol resin, benzocyclobutene (BCB), polybenzoxazole (PBO), other suitable polymer-based dielectric material, or a combination thereof. In some embodiments, the bonding dielectric material layers 180a, 280a are formed by spin-on coating, CVD, plasma enhanced CVD, or the like.

Referring to FIGS. 1D-1E and FIGS. 2D-2E, the bonding dielectric material layers 180a and 280a are patterned to form bonding dielectric layers 180 and 280. The bonding dielectric material layers 180a and 280a may be patterned through a dual-damascene process. For example, at least a portion of the bonding dielectric material layers 180a, 280a and at least a portion of the protective layer 150, 250 may be removed to form trench openings OP1, OP3 and via openings OP2, OP4. In some embodiments, the trench openings OP1 communicate with the via openings OP2 while the trench openings OP3 communicate with the via openings OP4. In some embodiments, the trench openings OP1 and the via openings OP2 expose at least a portion of the trench portion 149 of the interconnection structure IN1. Similarly, the trench openings OP3 and the via openings OP4 expose at least a portion of the trench portion 249 of the interconnection structure IN2. After the trench openings OP1, OP3 and the via openings OP2, OP4 are formed, a conductive material is filled into the trench openings OP1, OP3 and the via openings OP2, OP4 to form inductor bonding pads 192, 292 and bonding vias 194, 294. During the formation of the trench openings OP1, OP3 and the via openings OP2, OP4, other openings may be formed in the bonding dielectric material layers 180a and 280a. In some embodiments, some of these openings expose the conductive pads 170 and the rest of these openings is a recess without exposing any underlying conductive elements. In some embodiments, the conductive material is also filled into these openings to form interconnection bonding pads 196, 296, dummy bonding pads 197, 297, and conductive vias 198, 298. In some embodiments, the inductor bonding pad 192, the bonding via 194, the interconnection bonding pads 196, the dummy bonding pads 197, and the conductive vias 198 are collectively referred to as the bonding metallization patterns 190. Similarly, the inductor bonding pad 292, the bonding via 294, the interconnection bonding pads 296, the dummy bonding pads 297, and the conductive vias 298 are collectively referred to as the bonding metallization patterns 290. In some embodiments, a material of the bonding metallization patterns 190 and 290 may include aluminum, titanium, copper, nickel, tungsten, and/or alloys thereof. In some embodiment, the bonding metallization patterns 190 or 290 may be made of the same material as the corresponding inductor patterns 140 or 240 and the interconnection conductive patterns 130 or 230. In some embodiments, the material of the bonding metallization patterns 190 or 290 may be different from the material of the corresponding inductor patterns 160 or 260.

Figure 1E:
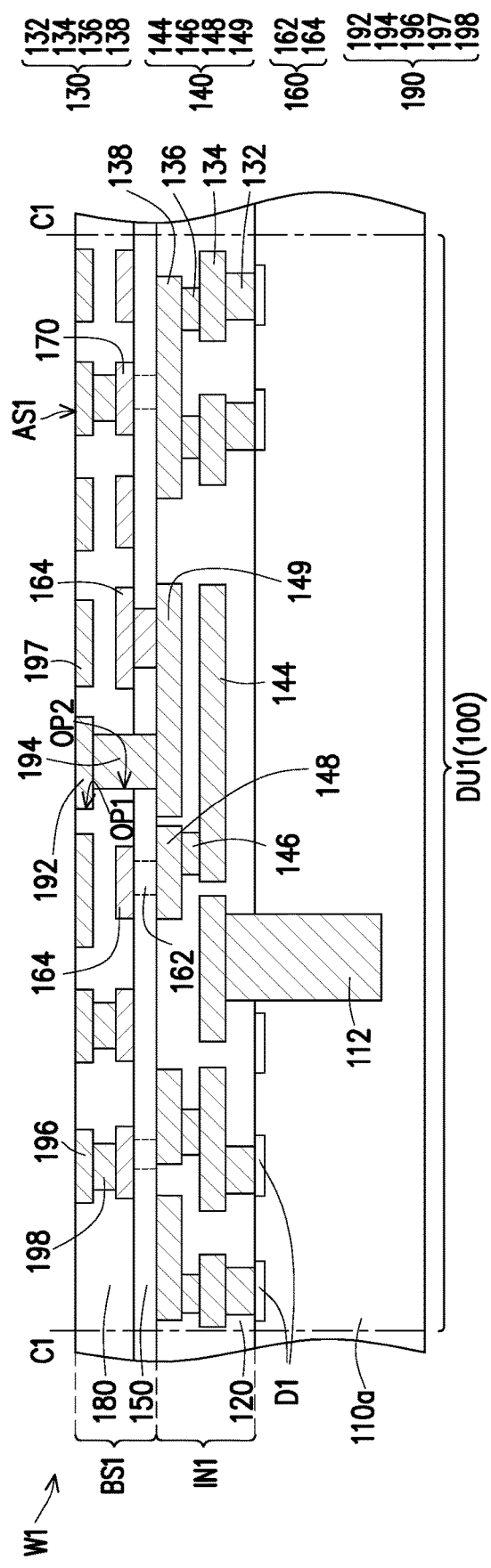

As illustrated in FIG. 1E, the inductor bonding pad 192 is connected to the trench portion 149 of the inductor pattern 140 through the bonding via 194. In some embodiments, the inductor bonding pad 192 and the bonding via 194 are collectively referred to as inductor bonding metallurgies. In some embodiments, the inductor patterns 140, 160 and the inductor bonding metallurgies 192, 194 are collectively referred to as an inductor wire fragment. In some embodiments, the interconnection bonding pads 196 may be connected to the conductive pads 170 through the conductive vias 198 and the dummy bonding pads 197 may be electrically floating. That is, the dummy bonding pad 197 may be disposed over the inductor patterns 160 without being electrically connected to the inductor patterns 160. In some embodiments, the top surface of the inductor bonding pad 192, the top surface of the interconnection bonding pads 196, the top surface of the dummy bonding pads 197, and the top surface of the bonding dielectric layer 180 are substantially located at the same level height to provide an appropriate active surface AS1 for hybrid bonding. The protective layer 150, the inductor patterns 160, the conductive pads 170, the bonding dielectric layer 180, and the bonding metallization patterns 190 are collectively referred to as a bonding structure BS1.

Figure 2E:
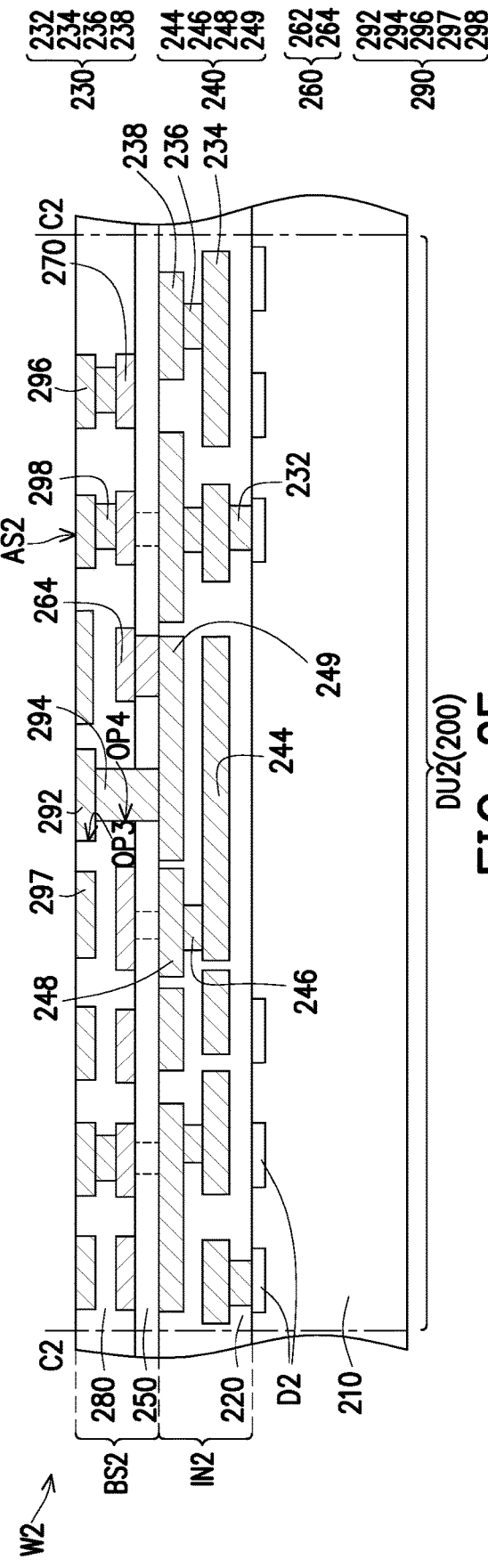
Figure 1F:
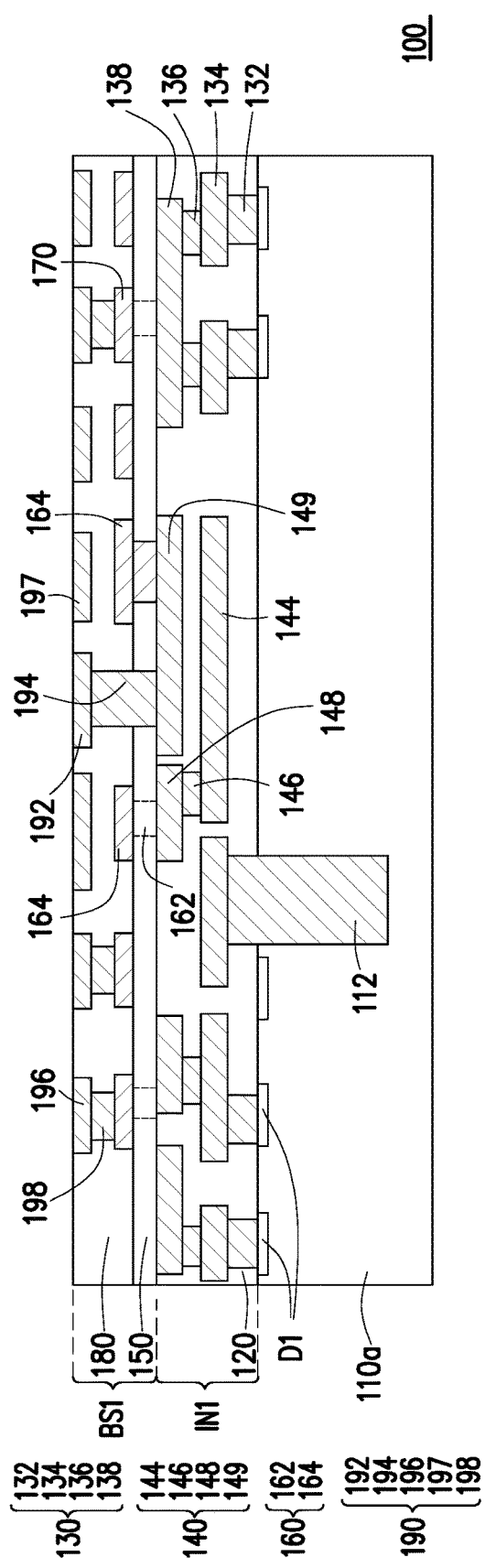
Figure 2F:
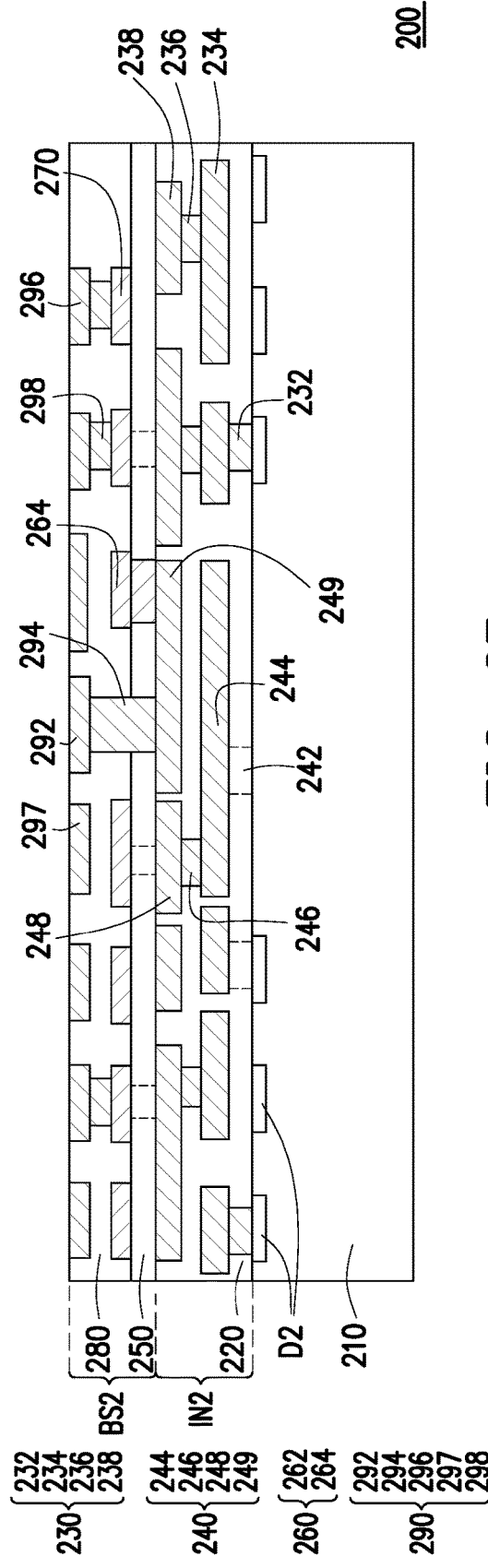

As illustrated in FIG. 2E, the inductor bonding pad 292 is connected to the trench portion 249 of the inductor pattern 240 through the bonding via 294. In some embodiments, the inductor bonding pad 292 and the bonding via 294 are collectively referred to as inductor bonding metallurgies. In some embodiments, the inductor patterns 240, 260 and the inductor bonding metallurgies 292, 294 are collectively referred to as an inductor wire fragment. In some embodiments, the interconnection bonding pads 296 may be connected to the conductive pads 270 through the conductive vias 298 and the dummy bonding pads 297 may be electrically floating. That is, the dummy bonding pad 297 may be disposed over the inductor patterns 260 without being electrically connected to the inductor patterns 260. In some embodiments, the top surfaces of the inductor bonding pads 292, the top surface of the interconnection bonding pads 296, the top surface of the dummy bonding pads 297, and the top surface of the bonding dielectric layer 280 are substantially located at the same level height to provide an appropriate active surface AS2 for hybrid bonding. The protective layer 250, the inductor patterns 260, the conductive pads 270, the bonding dielectric layer 280, and the bonding metallization patterns 290 are collectively referred to as a bonding structure BS2.

Referring to FIGS. 1E-1F and FIGS. 2E-2F, a singulation process may be performed to form a plurality of semiconductor dies 100 and a plurality of semiconductor dies 200. The singulation process may be performed by, for example, cutting through the semiconductor wafers W1 and W2 along the corresponding scribe lines C1 or C2 located between each die unit DU1 or each die unit DU2. In some embodiments, the singulation process typically involves performing a wafer dicing process with a rotating blade and/or a laser beam. In some embodiments, the singulation step is optional and may be skipped. In some embodiments, the semiconductor dies 100 and 200 may be dies capable of performing storage function. For example, each of the semiconductor dies 100 and 200 may independently be a Dynamic Random Access Memory (DRAM), a Resistive Random Access Memory (RRAM), a Static Random Access Memory (SRAM), or the like. However, the disclosure is not limited thereto. In some alternative embodiments, the semiconductor dies 100 and the semiconductor dies 200 may independently be a Central Process Unit (CPU) die, a Graphic Process Unit (GPU) die, a Field-Programmable Gate Array (FPGA), or the like. In some embodiments, each one of the semiconductor dies 100 and 200 has an inductor wire fragment of an inductor formed therein.

Figure 3A:
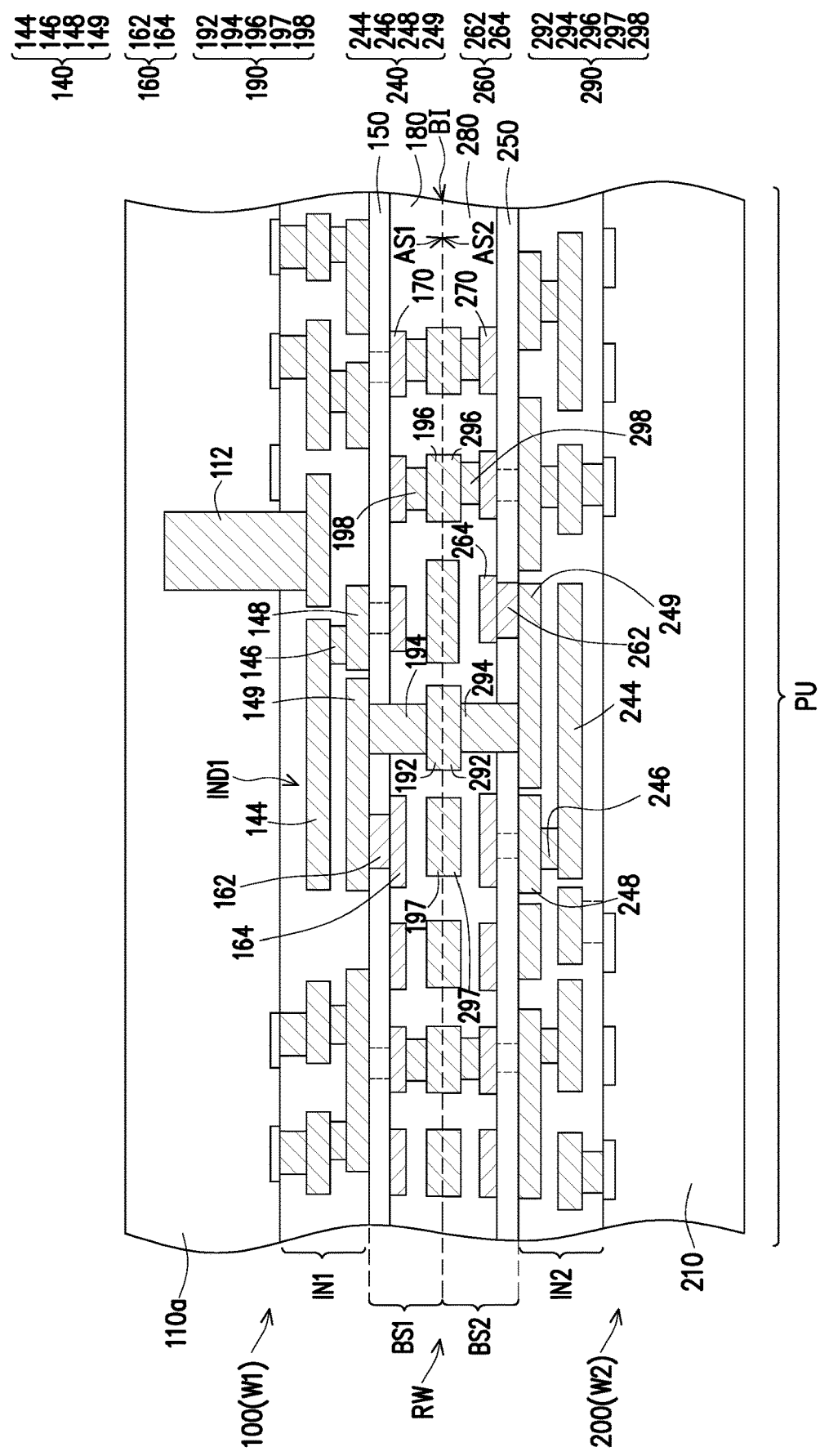
FIG. 3A to FIG. 3J are schematic cross-sectional views illustrating a manufacturing process of a semiconductor package in accordance with some embodiments of the disclosure.

FIG. 3A to FIG. 3J are schematic cross-sectional views illustrating a manufacturing process of a semiconductor package 10 in accordance with some embodiments of the disclosure. Referring to FIG. 3A, the singulation step of the two semiconductor wafers W1 and W2 illustrated in FIGS. 1E-1F and FIGS. 2E-2F is skipped, and the two semiconductor wafers W1 and W2 are hybrid-bonded to each other to obtain a reconstructed wafer RW. In some embodiments, the reconstructed wafer RW includes a plurality of package units PU. In other words, the exemplary process may be performed at a reconstructed wafer level, so that multiple package units PU are processed in the form of the reconstructed wafer RW. In FIG. 3A, one package unit PU is shown for simplicity. However, the disclosure is not limited thereto. Multiple package units PU may be arranged in an array in the reconstructed wafer RW.

As illustrated in FIG. 3A, the semiconductor dies 100 included in the semiconductor wafer W1 may be hybrid bonded to the semiconductor dies 200 included in the semiconductor wafer W2. In some embodiments, a temperature of the hybrid bonding process ranges from about 200° C. to about 300° C. In some embodiments, the semiconductor wafer W1 is placed such that the active surfaces AS1 of the semiconductor dies 100 are in contact with the active surfaces AS2 of the semiconductor dies 200 in the semiconductor wafer W2. Furthermore, the inductor bonding pad 192, the interconnection bonding pads 196, and the dummy bonding pads 197 of the semiconductor dies 100 are substantially aligned with and in direct contact with the corresponding inductor bonding pad 292, the corresponding interconnection bonding pads 296, and the corresponding dummy bonding pads 297 of the semiconductor dies 200. That is, the inductor bonding pad 192 is bonded to the inductor bonding pad 292, the interconnection bonding pads 196 are bonded to the interconnection bonding pads 296 and the dummy bonding pads 197 are bonded to the dummy bonding pads 297. In some embodiments, the bonding dielectric layer 180 is directly in contact with the bonding dielectric layer 280. In some embodiments, to facilitate the hybrid bonding between the semiconductor dies 100 and the semiconductor dies 200, surface preparation for the bonding surfaces (i.e. the active surfaces AS1 and the active surfaces AS2) of the semiconductor wafer W1 and the semiconductor wafer W2 may be performed. The surface preparation may include surface cleaning and activation, for example. Surface cleaning may be performed on the active surfaces AS1, AS2 to remove particles on the bonding surfaces of the inductor bonding pads 192, 292, the bonding surfaces of the interconnection bonding pads 196, 296, the bonding surfaces of the dummy bonding pads 197, 297, and the bonding surfaces of the bonding dielectric layers 180, 280. In some embodiments, the active surfaces AS1, AS2 may be cleaned by wet cleaning, for example.

After cleaning the active surfaces AS1 and AS2, activation of the bonding surfaces of the bonding dielectric layers 180 and 280 may be performed for development of high bonding strength. For example, plasma activation may be performed to treat the bonding surfaces of the bonding dielectric layers 180 and 280. When the activated bonding surfaces of the bonding dielectric layers 180 and 280 are in contact with each other, the bonding dielectric layers 180 and 280 are pre-bonded. After pre-bonding the semiconductor dies 100 onto the semiconductor dies 200, a hybrid bonding step is performed. The hybrid bonding step may include a thermal treatment for dielectric bonding and a thermal annealing process for conductor bonding. In some embodiments, the thermal treatment for dielectric bonding is performed to strengthen the bonding between the bonding dielectric layer 180 and the bonding dielectric layer 280. After performing the thermal treatment for dielectric bonding, the thermal annealing for conductor bonding is performed to facilitate the bonding between the inductor bonding pads 192, the interconnection bonding pads 196, and the dummy bonding pads 197 with the corresponding inductor bonding pads 292, the corresponding interconnection bonding pads 296, and the corresponding dummy bonding pads 297. In some embodiments, the process temperature of the thermal annealing for conductor bonding is higher than that of the thermal treatment for dielectric bonding. After performing the thermal annealing for conductor bonding, the bonding dielectric layer 180 is bonded to the bonding dielectric layer 280. Meanwhile, the inductor bonding pads 192, the interconnection bonding pads 196, and the dummy bonding pads 197 are bonded to the corresponding underlying inductor bonding pads 292, the corresponding underlying interconnection bonding pads 296, and the corresponding underlying dummy bonding pads 297. As such, the upper dies (e.g., the semiconductor die 100) are hybrid bonded to the lower dies (e.g., the semiconductor dies 200). In some embodiments, a bonding interface BI may be visible at the contacting plane between the active surface AS1 of the semiconductor wafer W1 and the active surface AS2 of the semiconductor wafer W2.

It should be noted that although the reconstructed wafer RW in FIG. 3A is obtained by hybrid bonding the semiconductor wafer W1 and the semiconductor wafer W2, the disclosure is not limited thereto. In some alternative embodiments, one or both of the semiconductor wafers W1 and W2 may be subjected to a singulation process before the hybrid bonding process. As such, the reconstructed wafer RW may be obtained by hybrid bonding singulated semiconductor dies (e.g., semiconductor dies 100) with a semiconductor wafer (e.g., semiconductor wafer W2). For example, the semiconductor dies 100 may be picked-and-placed onto the semiconductor wafer W2 such that the semiconductor dies 100 are electrically connected to the semiconductor dies 200.

In some embodiments, upon bonding of the semiconductor dies 100 to the semiconductor dies 200, the inductor patterns 140, 160 and the inductor bonding metallurgies (the inductor bonding pad 192 and the bonding via 194) of the semiconductor die 100 are joint to the inductor patterns 240, 260 and the inductor bonding metallurgies (the inductor bonding pad 292 and the bonding via 294) of the semiconductor die 200 to define a conductive wire wrapping around a portion of dielectric material (a portion of the bonding dielectric layers 180, 280, a portion of the protective layer 150, 250, and the inter-dielectric layers 120, 220) to from an inductor IND1. In some embodiments, the semiconductor die 100 and the semiconductor die 200 respectively includes a wire fragment of the conductive wire feature of the inductor IND1. For example, the inductor patterns 140, 160 and the inductor bonding metallurgies (the inductor bonding pad 192 and the bonding via 194) of the semiconductor die 100 may constitute a first wire fragment of the inductor IND1, the inductor patterns 240, 260 and the inductor bonding metallurgies (the inductor bonding pad 292 and the bonding via 294) may constitute a second wire fragment of the inductor IND1, and the conductive wire of the inductor IND1 may include the first wire fragment and the second wire fragment.

Figure 3B:
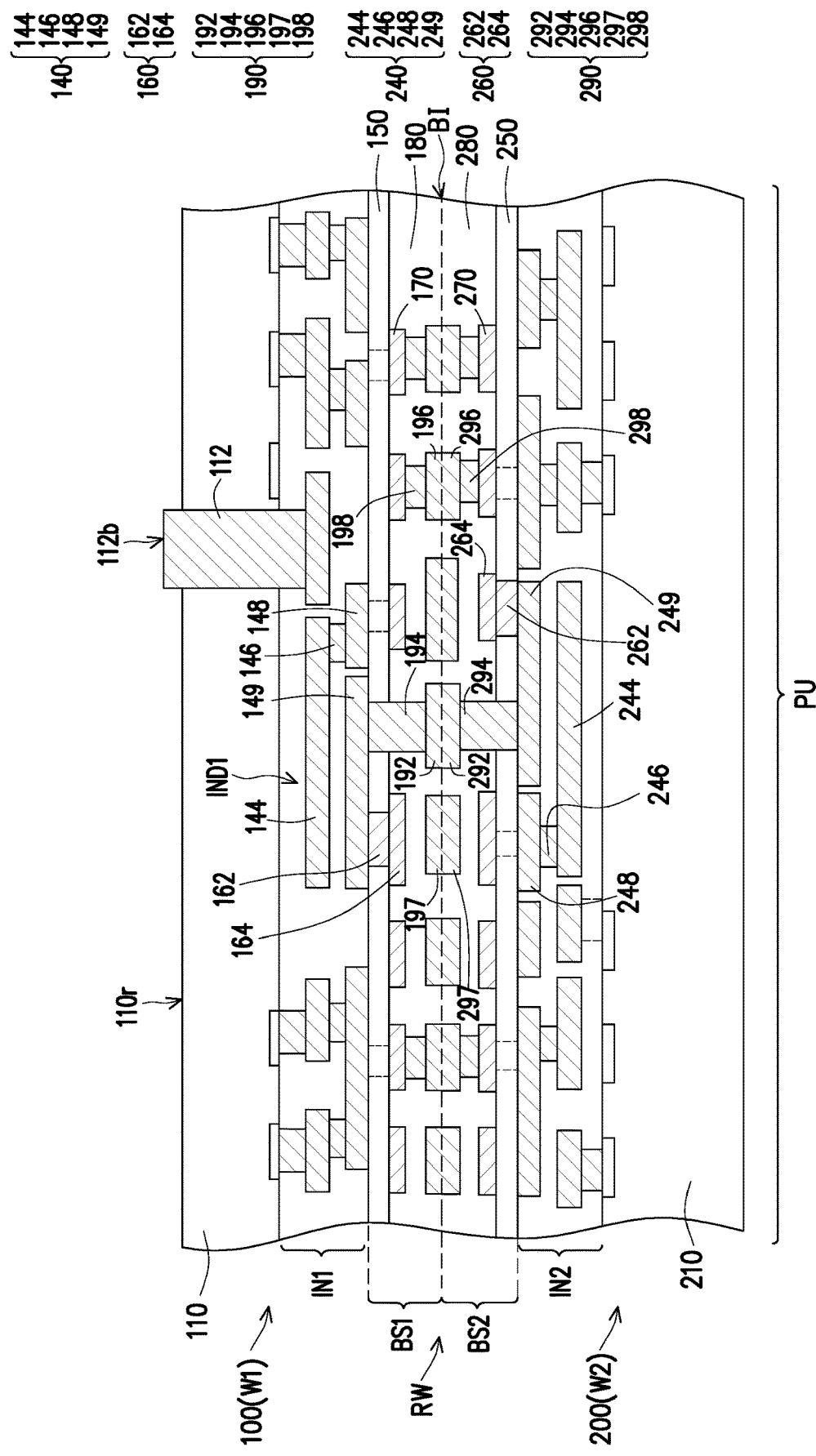

Referring to FIG. 3A and FIG. 3B, in some embodiments, the semiconductor substrate 110a is thinned from the side of the surface 110r to form a semiconductor substrate 110. In some embodiments, a portion of the semiconductor substrate 110 may be removed until the TSV 112 is revealed. As illustrated in FIG. 3B, following the thinning of the substrate 110a, the TSV 112 may protrude from the semiconductor substrate 110. That is, the surface 112b of the TSV 112 may be located at a level height higher than the surface 110r of the semiconductor substrate 110. In some embodiments, the portion of the semiconductor substrate 110a may be removed through an etching process. The etching process includes, for example, an isotropic etching process and/or an anisotropic etching process. For example, the semiconductor substrate 110a may be thinned through a wet etching process, a dry etching process, or a combination thereof.

Figure 3C:
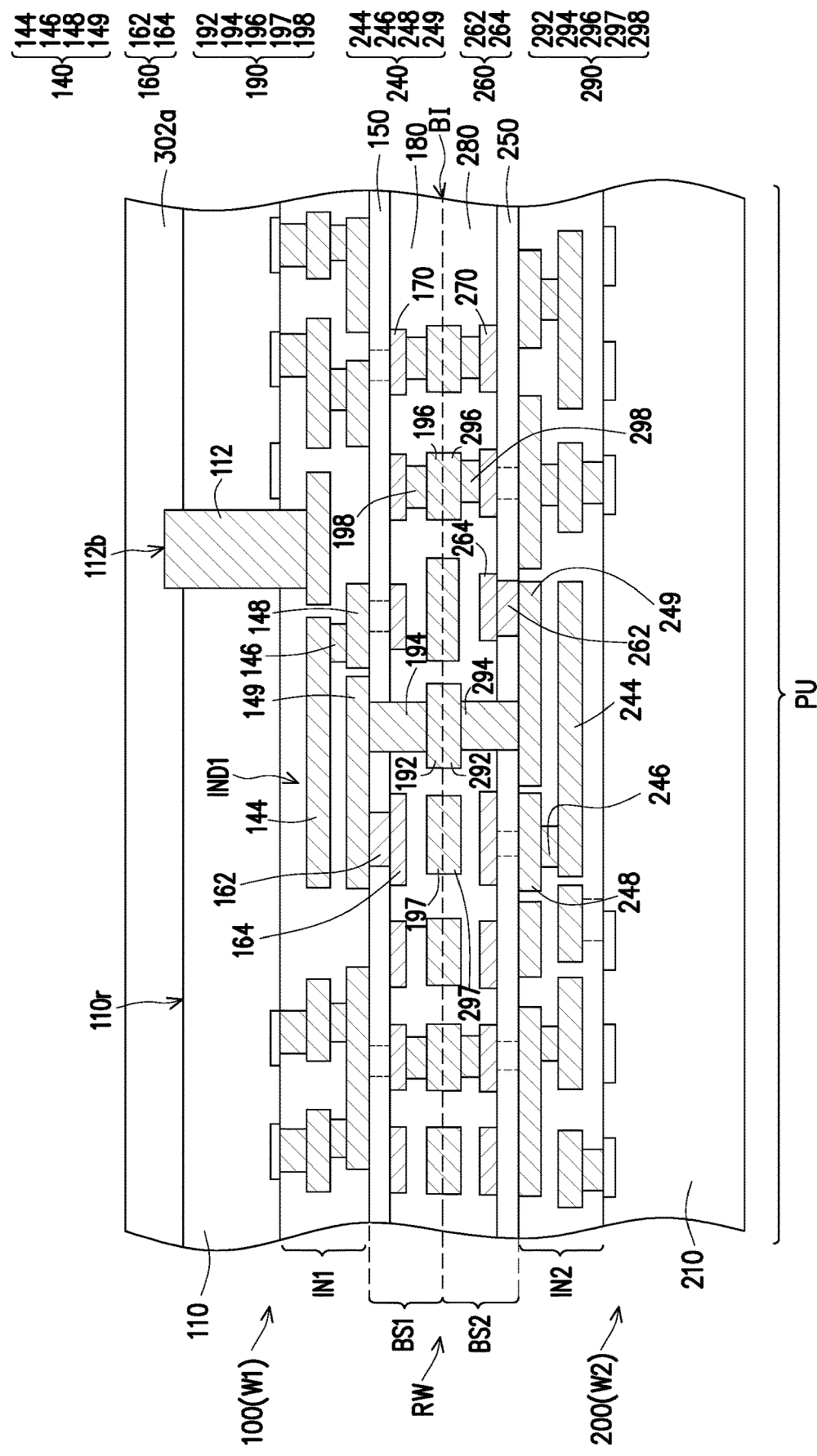

Referring to FIG. 3C, a first dielectric layer 302a is formed on the surface 110r of the semiconductor substrate 110. In some embodiments, the first dielectric layer 302a is formed to cover the surface 112b of the TSV 112. A material of the first dielectric layer 302a includes oxides. In some embodiments, the material of the first dielectric layer 302a includes silicon oxide ($SiO_2$), silicon nitride (SiN), silicon oxynitride (SiON), or the like. The first dielectric layer 302a may be formed by suitable fabrication techniques, such as spin-on coating, lamination, chemical vapor deposition (CVD), or the like.

Figure 3D:
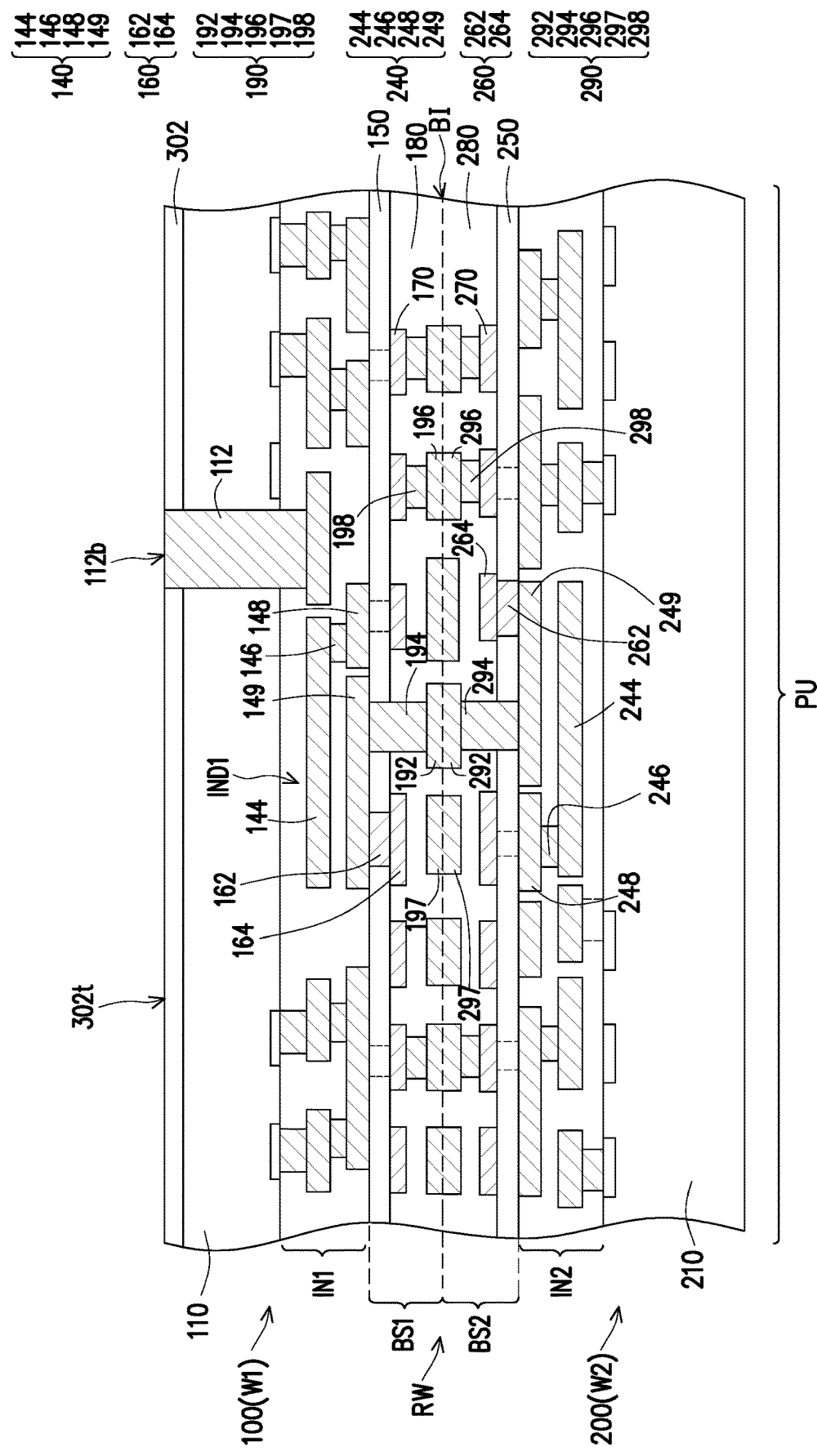

Referring to FIG. 3D, after the first dielectric layer 302a is formed, a planarization process is performed to thin the first dielectric layer 302a until the surface 112b of the TSV 112 is exposed, so as to form the first dielectric layer 302. In some embodiments, upon completion of the planarization process, the surface 112b of the TSV 112 may substantially coplanar with the surface 302t of the first dielectric layer 302. In some embodiments, the planarization of the first dielectric layer 302a includes performing a mechanical grinding process and/or a chemical mechanical polishing (CMP) process. In some embodiments, portions of the TSV 112 may also be removed during the planarization process.

Figure 3E:
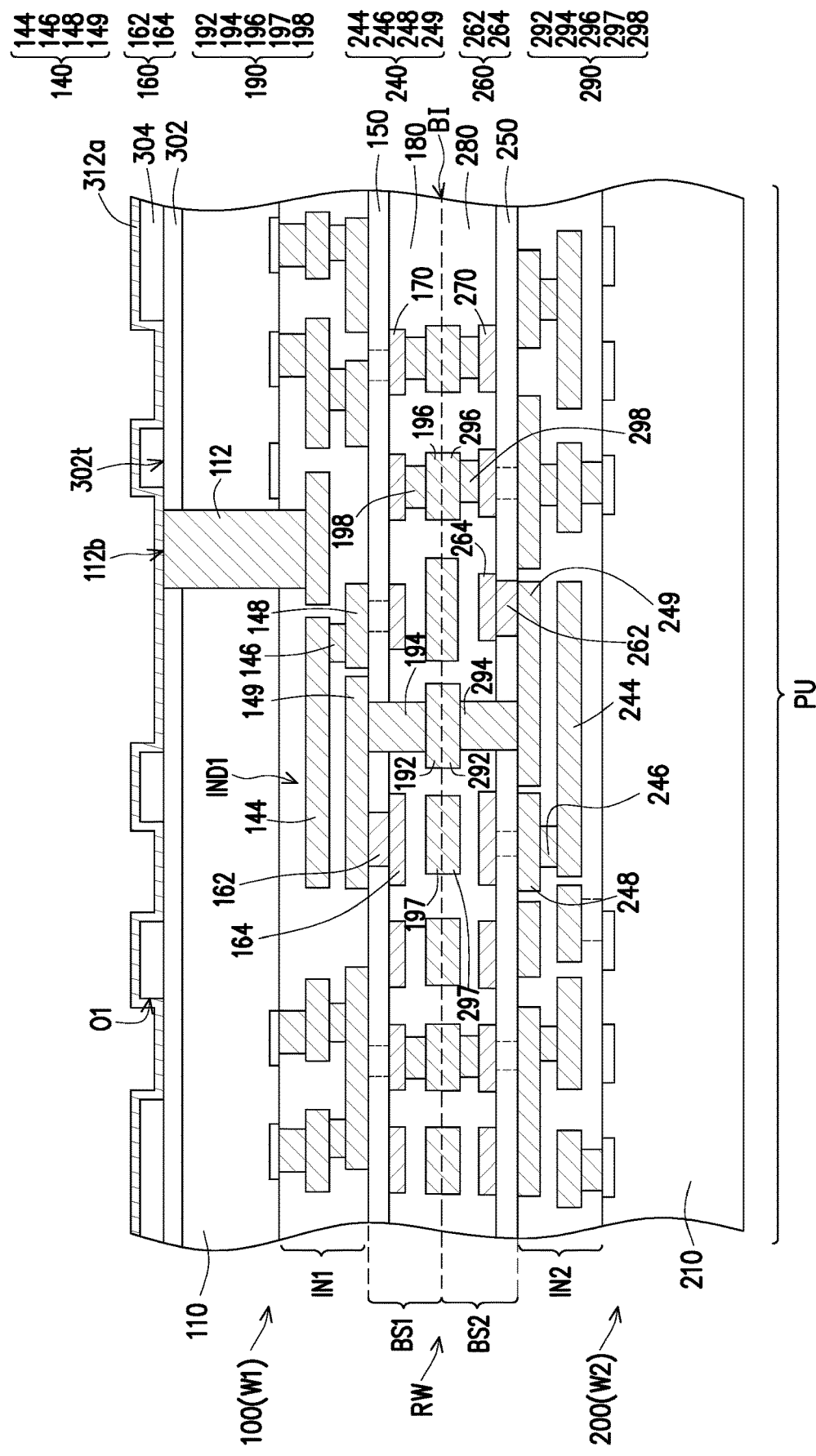

Referring to FIG. 3E, a second dielectric layer 304 is formed on the first dielectric layer 302. The second dielectric layer 304 has a plurality of openings O1 exposing the surface 112b of the TSV 112 and portions of the first dielectric layer 302. In some embodiments, a material of the second dielectric layer 304 may be similar to that of the first dielectric layer 302. For example, the second dielectric layer 304 may include oxides, such as silicon oxide. Thereafter, a seed material layer 312a is conformally formed over the second dielectric layer 304. In some embodiments, the seed material layer 312a is blanketly formed over the package unit PU. As illustrated in FIG. 3E, the seed material layer 312a extends into the openings O1 to be in direct contact with the TSV 112. In some embodiments, the seed material layer 312a may be formed through, for example, a sputtering process, a physical vapor deposition (PVD) process, or the like. In some embodiments, the seed material layer 312a may include, for example, copper, tantalum, titanium, a combination thereof, or other suitable materials. In some embodiments, a barrier layer (not shown) may be deposited before forming the seed material layer 312a to prevent undesired diffusion.

Figure 3F:
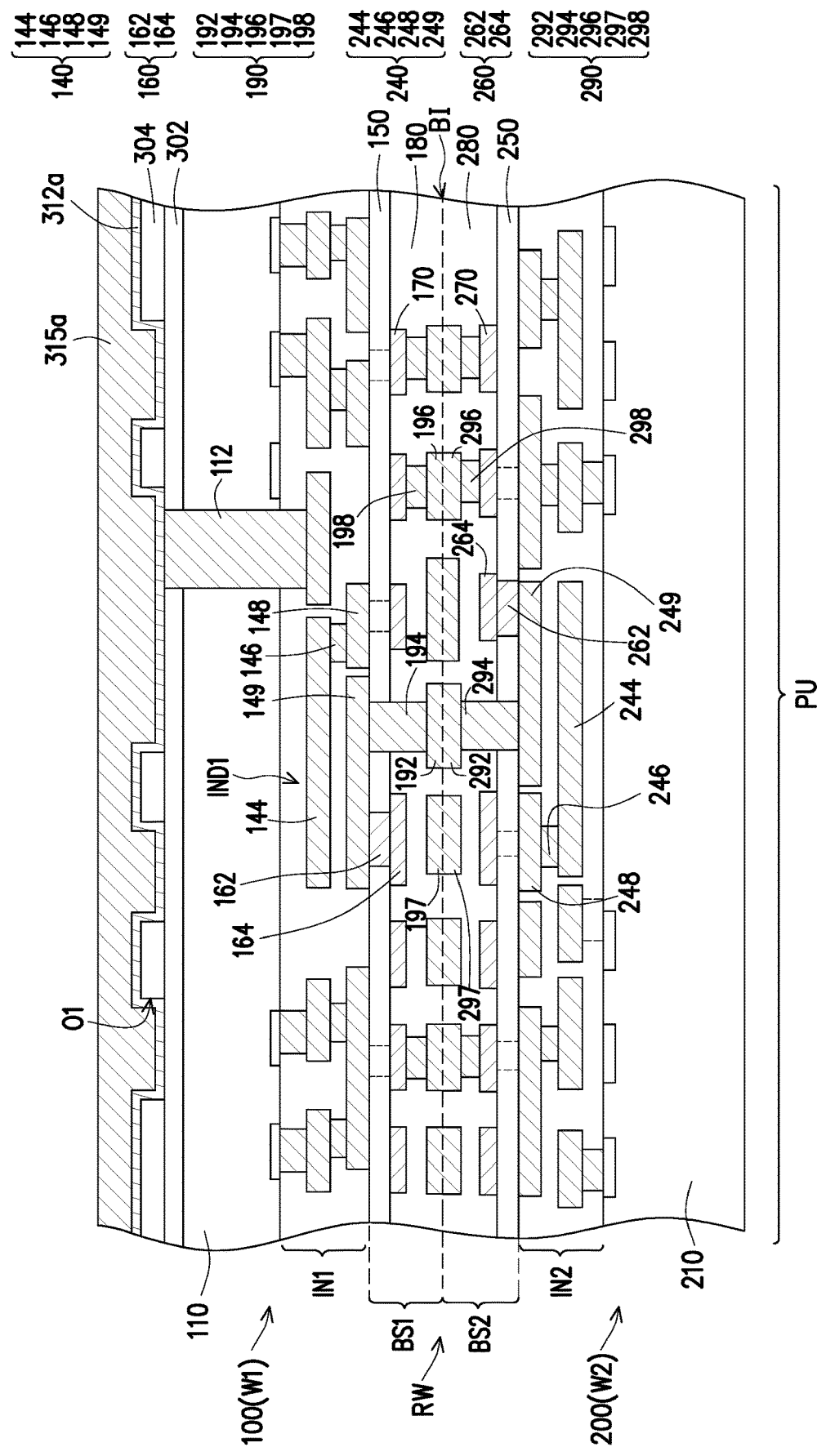

Referring to FIG. 3F, a conductive material 315a is deposited on the seed material layer 312a. In some embodiments, the conductive material 315a may include a metallic material such as copper, aluminum, platinum, nickel, titanium, tantalum, chromium, gold, silver, tungsten, a combination thereof, or the like. In some embodiments, the conductive material 315a is formed over the seed material layer 312a by electroplating, electroless plating, physical vapor deposition, chemical vapor deposition, or the like.

Figure 3G:
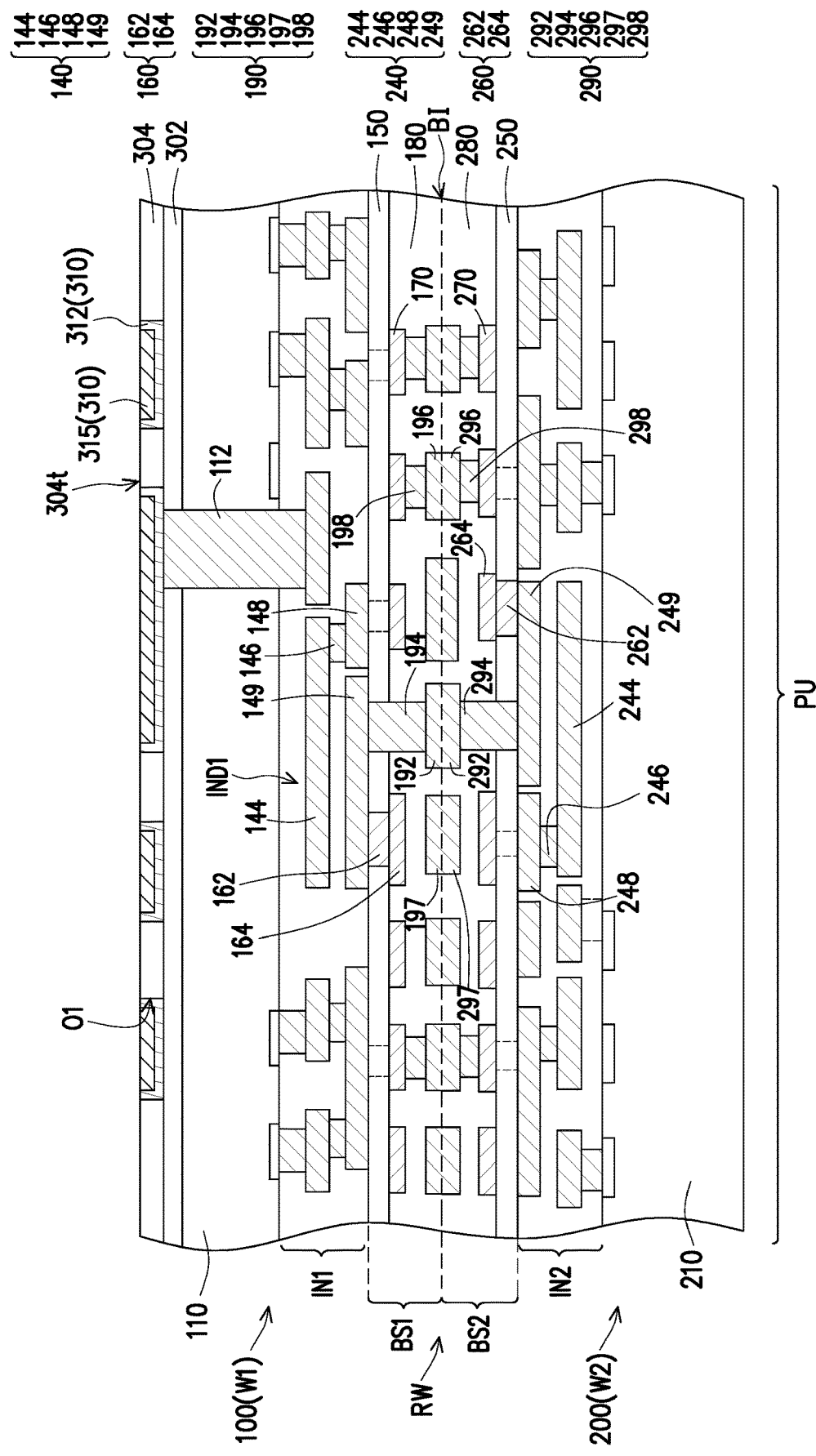

Referring to FIG. 3F and FIG. 3G, a planarization process is performed on the conductive material 315a until the second dielectric layer 304 is exposed. That is, portions of the conductive material 315a and portions of the seed material layer 312a disposed on the surface 304t of the second dielectric layer 304 may be removed to obtain first redistribution patterns 310 filling the openings O1. In some embodiments, each first redistribution pattern 310 includes a seed layer 312 and a conductive plug 315 disposed on the seed layer 312. In some embodiments, the conductive plug 315 is laterally surrounded by the seed layer 312. In some embodiments, at least a portion of the first redistribution patterns 310 is electrically and physically connected to the TSV 112.

Figure 3H:
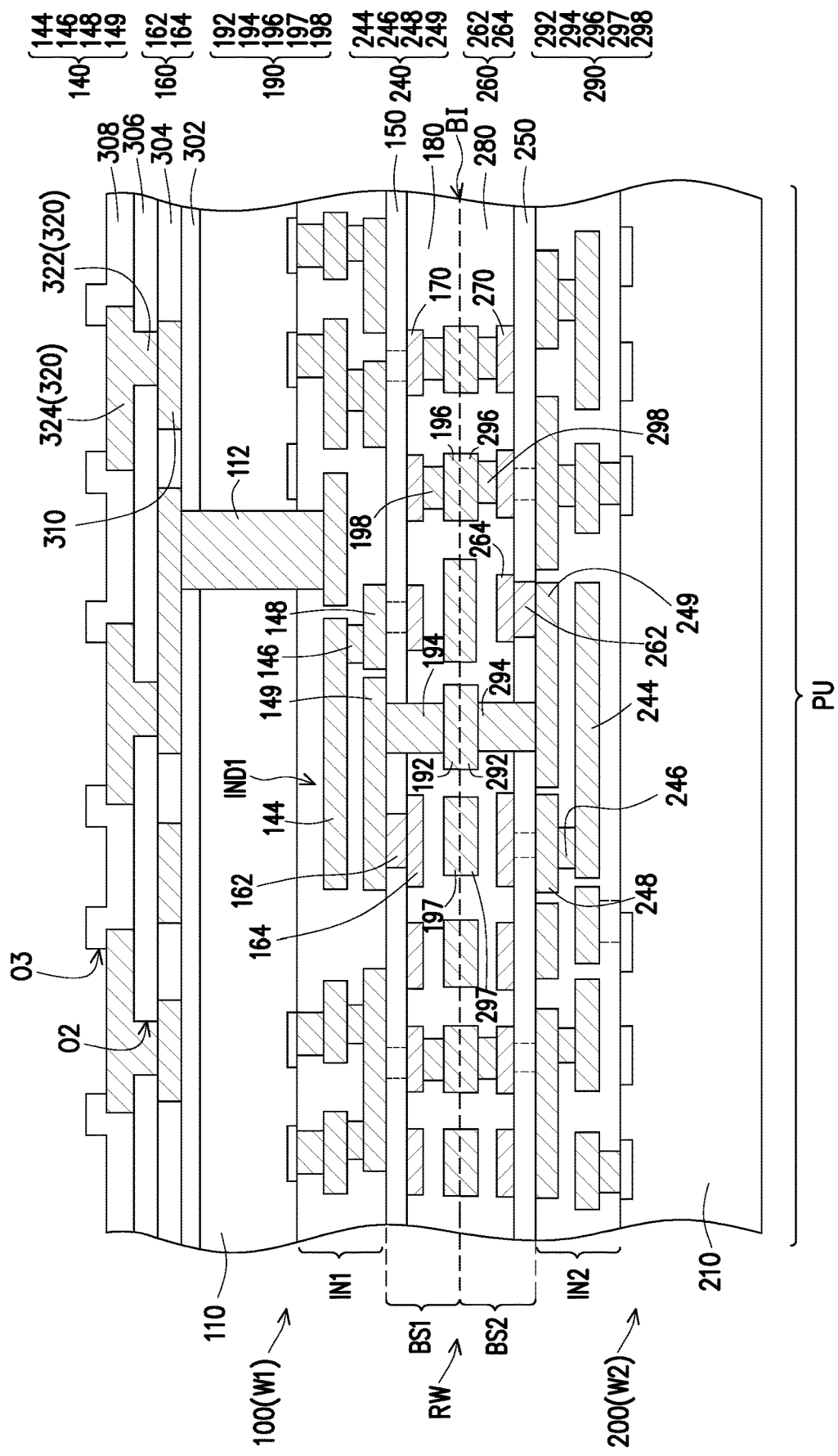

Referring to FIG. 3H, a third dielectric layer 306 is formed on the second dielectric layer 304. The third dielectric layer 306 has openings O2 revealing portions of some of the first redistribution patterns 310. In some embodiments, a material of the third dielectric layer 306 may be similar to that of the first dielectric layer 302 and/or the second dielectric layer 304. For example, the third dielectric layer 306 may include oxides, such as silicon oxide. A plurality of second redistribution patterns 320 is formed on the third dielectric layer 306. In some embodiments, each second redistribution pattern 320 may be divided into a via portion 322 and a trench portion 324. In some embodiments, the via portions 322 are located in the openings O2 and the trench portions 324 are disposed on the third dielectric layer 306. The via portions 320 allows electrical connection between the second redistribution pattern 320 and the first redistribution patterns 310. For simplicity, the seed layer 312 is omitted in FIG. 3H and the subsequent figures. It should be noted that each of the second redistribution patterns 320 may also include a seed layer and a conductive plug similarly to the first redistribution patterns 310. In some embodiments, the via portions 322 and the trench portions 324 of the second redistribution patterns 320 are formed simultaneously. After the second redistribution patterns 320 are formed, a first passivation layer 308 is formed on the third dielectric layer 306. The first passivation layer 308 extends beside the second redistribution patterns 320 on the third dielectric layer 306, and partially covers the trench portions 324 of the second redistribution patterns 320. That is, the first passivation layer 308 includes openings O3 exposing part of the trench portions 324. In some embodiments, the first passivation layer 308 may be blanketly formed over the package unit PU and a patterning process (e.g., deposition, photolithography and etching) may be performed to form the openings O3. In some embodiments, a material of the first passivation layer 308 includes, for example, polyimide, epoxy resin, acrylic resin, phenol resin, benzocyclobutene (BCB), polybenzoxazole (PBO), combinations thereof, or other suitable dielectric materials.

Figure 3I:
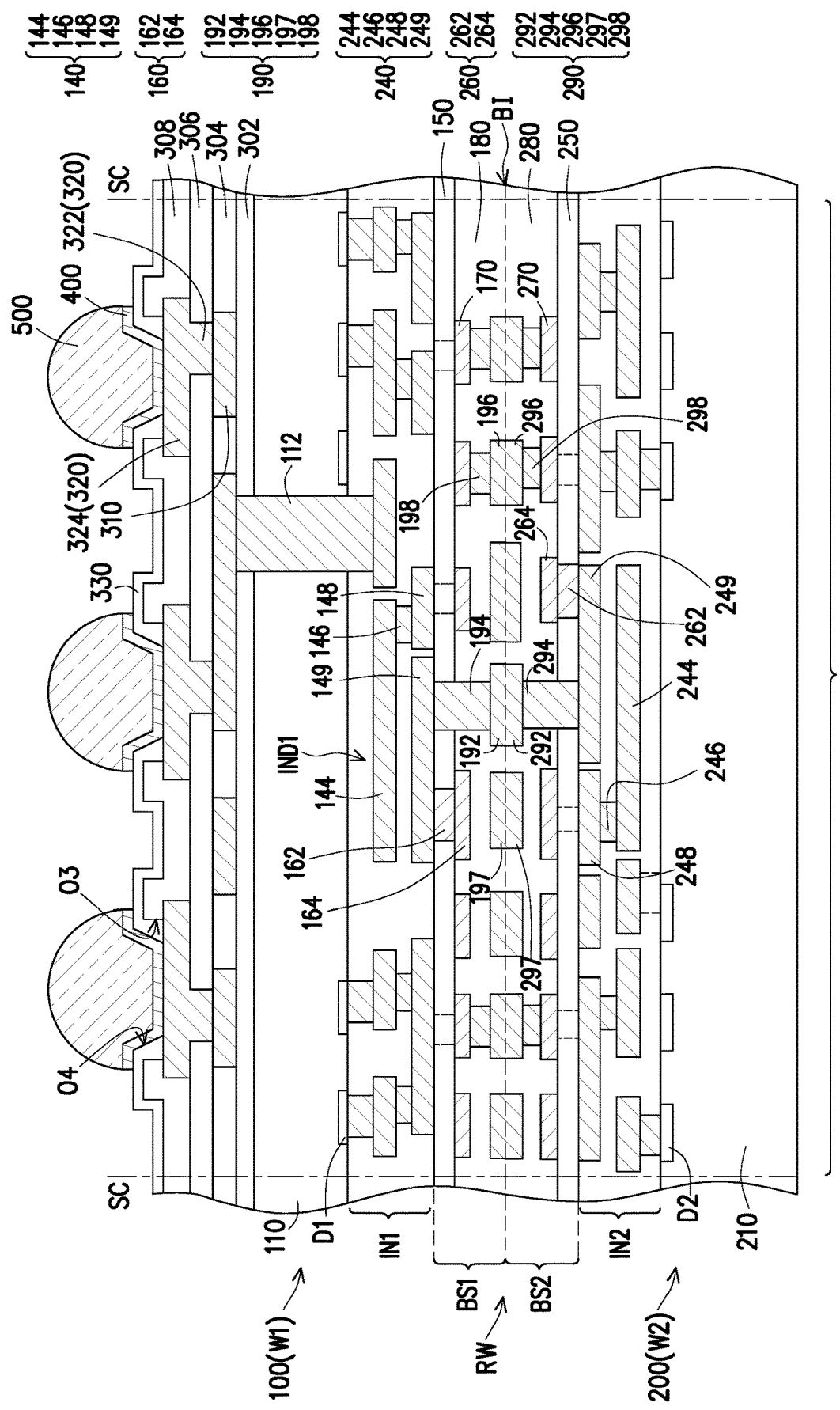

Referring to FIG. 3I, a second passivation layer 330 is disposed on the first passivation layer 310. In some embodiments, the second passivation layer 330 covers the first passivation layer 310 and partially extends into the openings O3. For example, the second passivation layer 330 extends into the openings O3 to partially cover the trench portions 324 of the second redistribution patterns 320. That is, the second passivation layer 330 may include openings O4 exposing part of the trench portions 324 revealed by the openings O3. As illustrated in FIG. 3I, the openings O3 of the first passivation layer 308 is wider than the openings O4 of the second passivation layer 330. In some embodiments, the first passivation layer 308 and the second passivation layer 330 may include different materials. In some alternative embodiments, a material of the second passivation layer 330 may be the same as that of the first passivation layer 308. For example, the material of the second passivation layer 330 includes polyimide, epoxy resin, acrylic resin, phenol resin, benzocyclobutene (BCB), polybenzoxazole (PBO), combinations thereof, or other suitable dielectric materials.

In some embodiments, under-bump metallurgies (UBM) 400 may be conformally formed in the openings O4. In some embodiments, the under-bump metallurgies 400 may further extend over portions of the second passivation layer 330 surrounding the openings O4. In some embodiments, a material of the under-bump metallurgies 400 includes copper, nickel, tin, palladium, gold, titanium, aluminum, or alloys thereof. In some embodiments, multiple layers of conductive material may be stacked to form the under-bump metallurgies 400. In some embodiments, the under-bump metallurgies 400 may be formed by a plating process. The plating process is, for example, electro-plating, electroless-plating, immersion plating, or the like. Thereafter, a plurality of conductive terminals 500 are formed over the under-bump metallurgies 400. In some embodiments, the conductive terminals 500 are electrically connected to the semiconductor die 100 via the redistribution patterns 310 and 320. The conductive terminals 500 include, for example, solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e. g, a metal pillar with a solder ball attached), or the like.

Figure 3J:
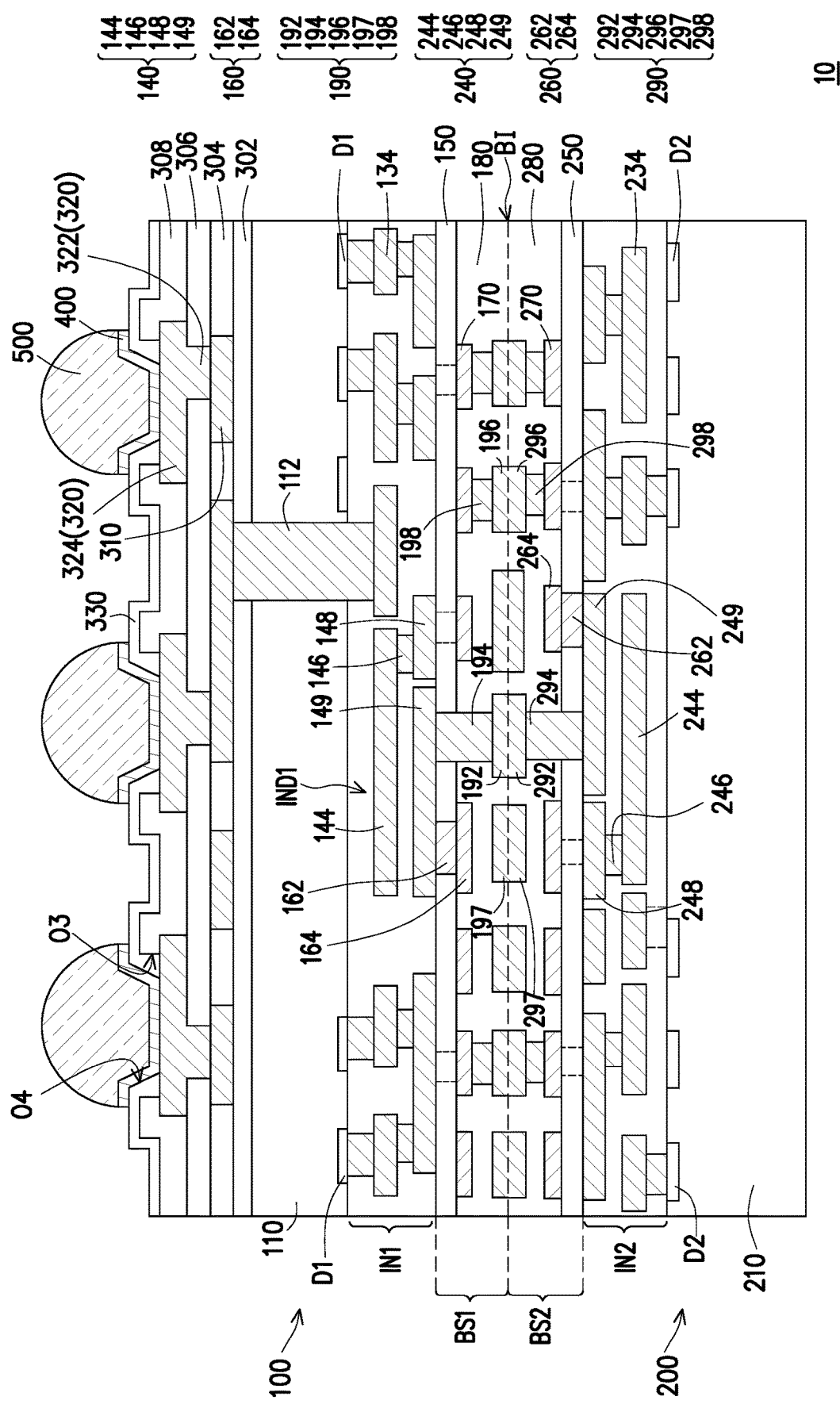

Referring to FIGS. 3I and 3J, a singulation process is performed to form a plurality of semiconductor packages 10. The singulation process may be performed by, for example, cutting through the reconstructed wafer RW along the scribe lines SC located between each package unit PU. In some embodiments, the dicing process or the singulation process typically involves dicing with a rotating blade or a laser beam. In other words, the dicing or singulation process is, for example, a laser cutting process, a mechanical cutting process, or other suitable processes.

Figure 3K:
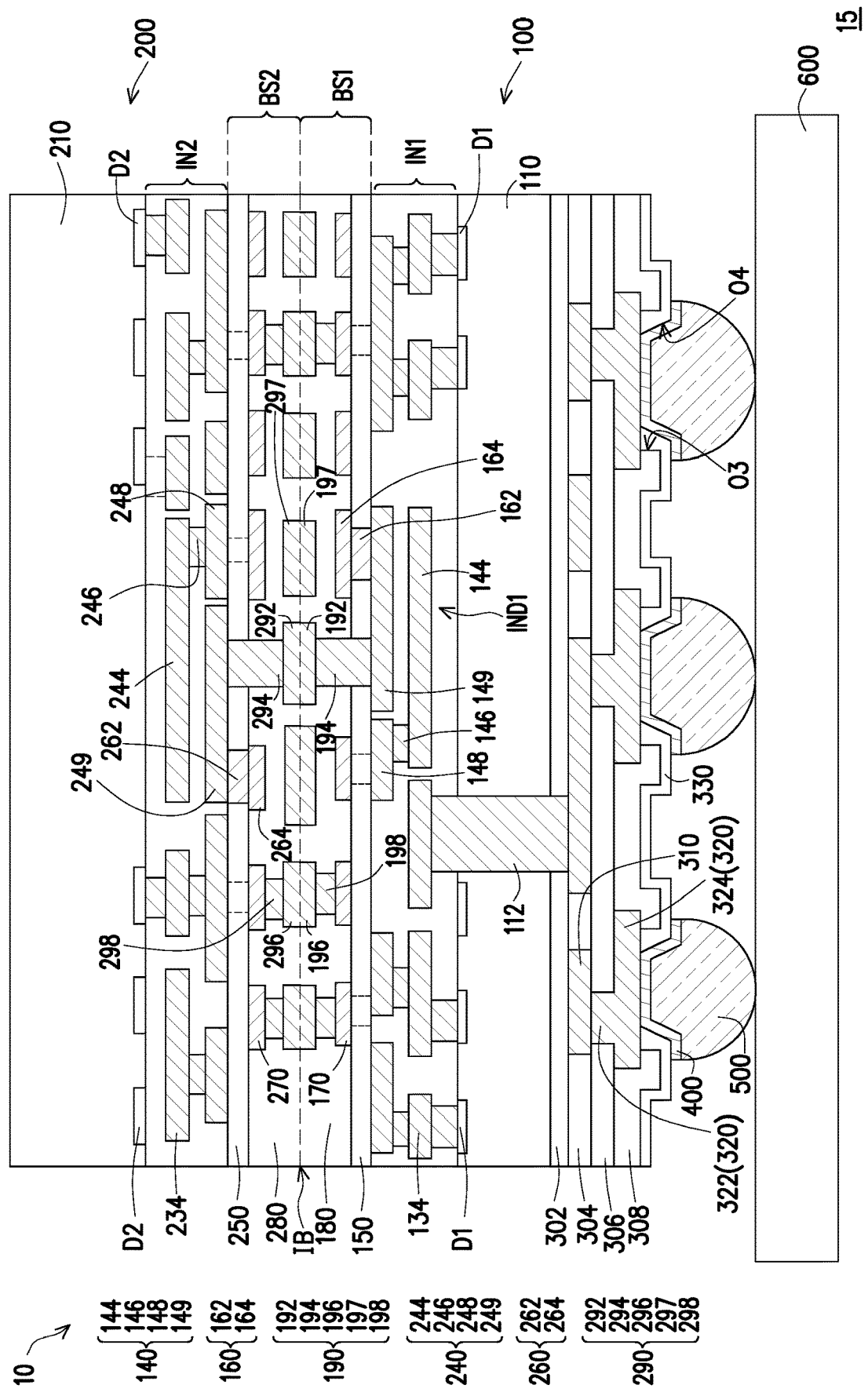
FIG. 3K is a schematic cross-sectional view illustrating an electronic device in accordance with some embodiments of the disclosure.

FIG. 3K is a schematic cross-sectional view illustrating an electronic device 15 in accordance with some embodiments of the disclosure. Referring to FIG. 3K, the semiconductor package 10 is stacked on a circuit substrate 600 to form an electronic device 15. In some embodiments, the circuit substrate 600 may be a motherboard, a printed circuit board, or the like. In some embodiments, the semiconductor package 10 is connected to the circuit substrate 600 through the conductive terminals 500.

Figure 4A:
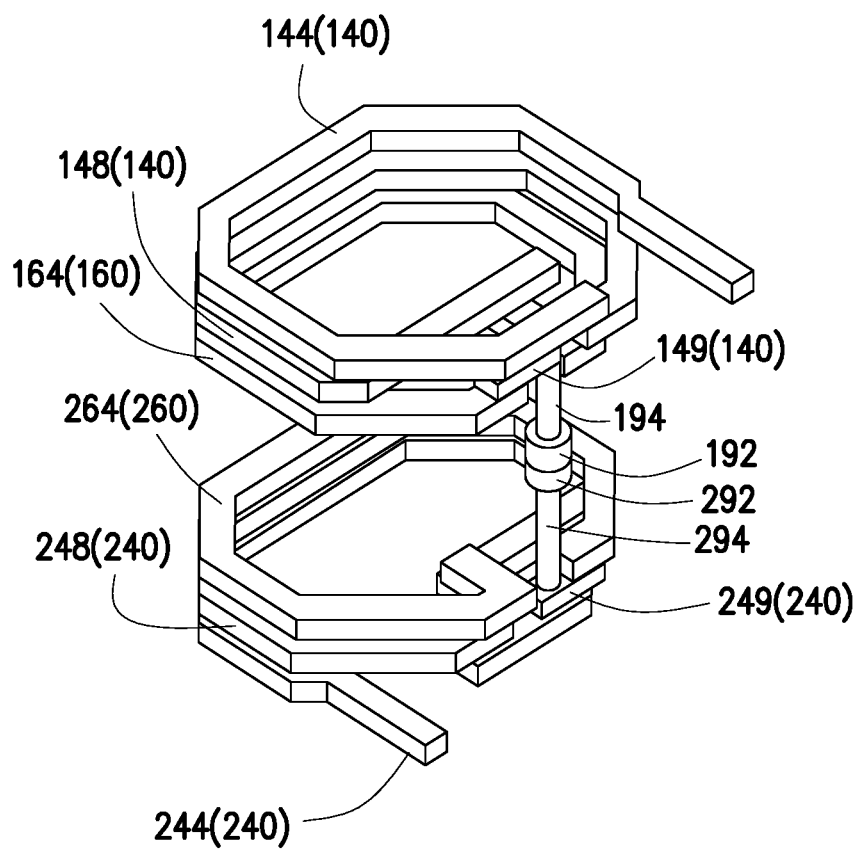
FIG. 4A is a schematic perspective view of an inductor of the semiconductor package in FIG. 3K.
Figure 4B:
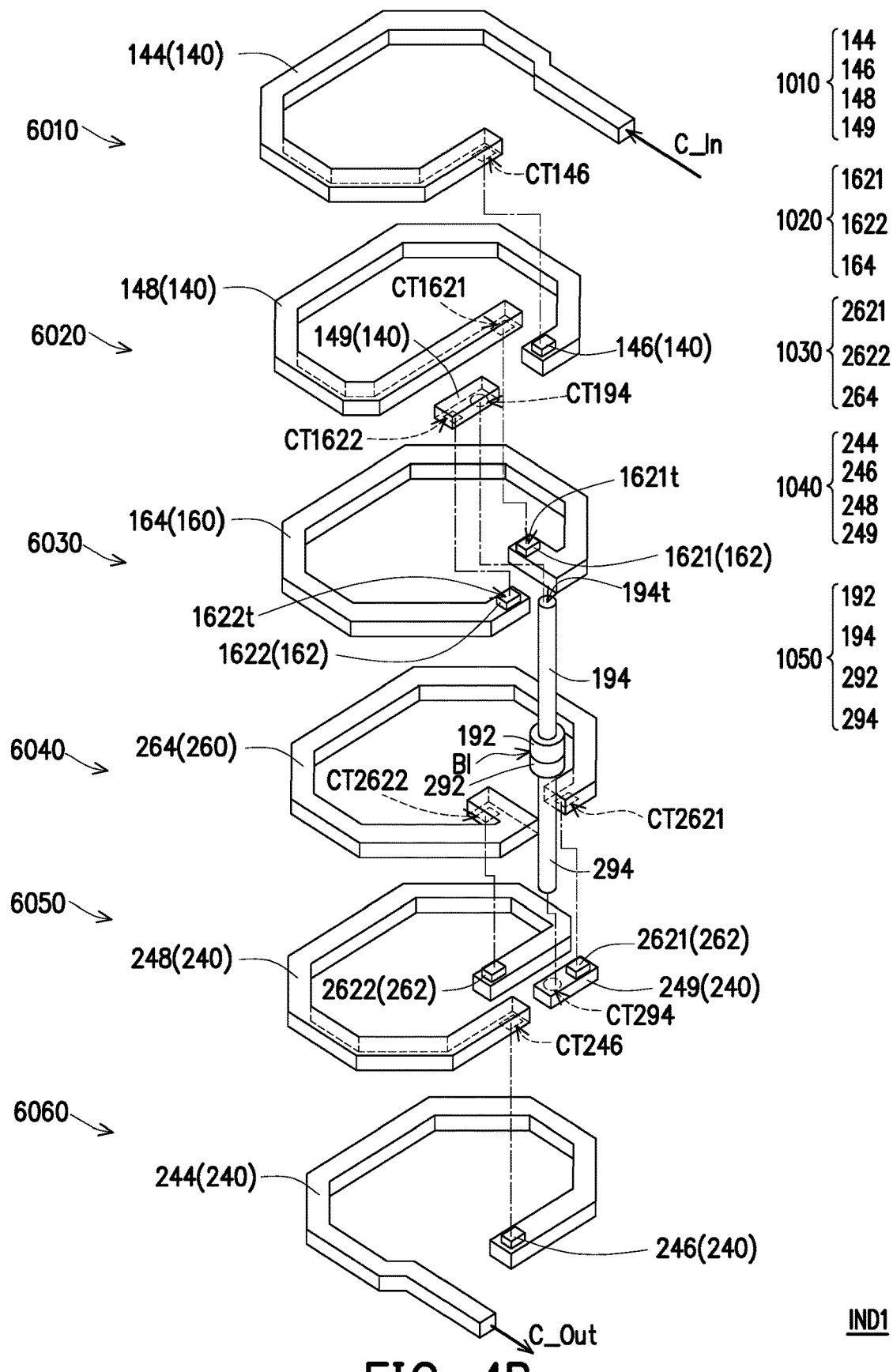
FIG. 4B is a schematic exploded view of the inductor in FIG. 4A.

FIG. 4A is a schematic perspective view of the inductor IND1 of the semiconductor package 10 in FIG. 3K. FIG. 4B is a schematic exploded view of the inductor IND1 in FIG. 4A. The conductive wire in the inductor IND1 is illustrated in FIG. 4A and FIG. 4B. On the other hand, the dielectric materials (i.e. the bonding dielectric layers 180, 280, the protective layer 150, 250, and the inter-dielectric layers 120, 220) are omitted in FIG. 4A and FIG. 4B for simplicity. Furthermore, in the exploded views, elements are shown as disposed directly on top of another element to provide a deeper insight into the structure of the inductors of the disclosure, with no bearing on the manufacturing process of the inductors. For example, the vias portions 2621 and 2622 are shown on the trench portions 248, 249 for clarity of illustration, even though, from a manufacturing perspective, the vias portions 2621 and 2622 are formed (integrally formed) with the trench portion 264 rather than the trench portions 248, 249. The areas labelled "CT" followed by a reference numeral in the drawings indicate the contact areas between the element on which the areas CT are drawn and the element indicated by the reference numeral. For example, the contact area CT146 drawn on the trench portion 144 in FIG. 4B indicates the region in which the via portion 146 contacts the trench portion 144. The dotted lines provide a visual guide to connect individual elements with the corresponding contact areas.

Referring to FIG. 4A and FIG. 4B, in some embodiments, the inductor IND1 includes multiple winding portions having one or more metallization layers of the interconnection structures IN1, IN2 and one or more metallization layers included in the bonding structures BS1, BS2. In some embodiments, different winding portions may include different conductive materials. For example, the inductor IND1 includes a winding portion 1010 formed by the inductor patterns 140, a winding portion 1020 formed by the inductor patterns 160, a winding portion 1030 formed by the inductor patterns 260, a winding portion 1040 formed by the inductor patterns 240, and a bonding portion 1050 formed by the inductor bonding metallurgies (the inductor bonding pad 192, the bonding via 194, the inductor bonding pad 292, and the bonding via 294). In some embodiments, a material of the winding portion 1010 is the same as a material of the winding portion 1040 and the bonding portion 1050. On the other hand, the material of the winding portion 1010 is different from a material of the winding portion 1020 and the winding portion 1030. In some embodiments, the material of the winding portion 1020 and the winding portion 1030 is the same. In some alternative embodiments, the winding portion 1020 and the winding portions 1030 include different materials. For example, the trench portions 144, 148, 149, 244, 248, 249, the via portions 146, 246 and the bonding metallurgies (the inductor bonding pads 192, 292 and the bonding vias 194, 294) may be made of copper, and the via portions 1621, 1622, 2621, 2622 and the trench portions 164, 264 may be made of aluminum. In some embodiments, since the winding portions 1010 to 1040 of the inductor IND1 are distributed between the two semiconductor dies 100 and 200 (i.e. the inductor IND1 extends from the semiconductor die 100 to the semiconductor die 200), the thickness of the individual winding portions 1010 to 1040 may be reduced without compromising the performances of the inductor IND1. The reduced thickness of the metallization layers, in turn, facilitates planarization of the active surfaces AS1 and AS2, thereby improving the bonding between the semiconductor dies 100 and 200. As such, the overall yield and the reliability of the semiconductor package 10 may be increased, thereby reducing the manufacturing cost.

As illustrated in FIG. 4A and FIG. 4B, the inductor IND1 includes six vertically stacked coils 6010 to 6060 electrically connected in series. In some embodiments, the trench portion 144 of the inductor pattern 140 is in the shape of an open loop and constitutes the coil 6010 of the inductor IND1. On the other hand, the trench portion 148 of the inductor patterns 140 may constitute the coil 6020 of the inductor IND1. In some embodiments, the trench portion 144 (the coil 6010) is connected to the trench portion 148 (the coil 6020) through the via portion 146. For example, the via portion 146 is electrically and physically contacting both the trench portion 148 and the trench portion 144. In some embodiments, the via portion 146 physically contacts the trench portion 144 at the contact area CT146. In some embodiments, the contact area CT146 is located close to an end of the trench portion 144. The other end of the trench portion 144 may be connected to the devices D1 (shown in FIG. 3J) by an inductor via (not shown) or by interconnection patterns 134 (shown in FIG. 3J). In same embodiment, the trench portion 144 and the interconnection patterns 134 are integrally formed, that is, no clear interface may be seen between the two. The trench portion 144 and the trench portion 148 may be located at different level heights, and the via portion 146 may bridge the distance between the two level heights. In some embodiment, the via portion 146 reaches one end of the trench portion 148. The trench portion 148 also has the shape of an open loop and contacts the via portion 1621 at the contact area CT1621 located at the other end of the open loop with respect to the via portion 146.

In some embodiments, the via portion 1621 is disposed at one end of the trench portion 164. The trench portion 164 may be in the form of an open loop and constitute the coil 6030 of the inductor IND1. The trench portion 164 is located at a different level height than the trench pattern 148, and the via portion 1621 may bridge the distance between the two level heights. The via portion 1622 is disposed at the other end of the trench portion 164 and establishes electrical connection with the trench portion 149 of the inductor patterns 140 at the contact area CT1622. The trench portion 149 is at the same level height as the trench portion 148. In some embodiments, the trench portion 149 is shorter than the trench portion 148. Herein, the length of a trench portion is the distance between the two ends of the trench portion as measured along the top surface of the trench portion. In other words, the length of a trench portion is considered as the length of the rectified trench portion. The trench portion 149 establishes electrical connection between the via portion 1622 at the contact area CT1622 and the bonding via 194 at the contact area CT194, and may be referred to as a bridging portion. In some embodiments, top surfaces 1621t, 1622t of the via portions 1621, 1622 and the top surface 194t of the bonding via 194 are at the same level height (are substantially coplanar with each other). The bonding via 194 reaches the inductor bonding pad 192, which is hybrid bonded to the inductor bonding pad 292. The bonding interface BI may be visible between the inductor bonding pad 192 and the inductor bonding pad 292. The bonding via 294 establishes electrical connection between the inductor bonding pad 292 and the trench portion 249 at the contact area CT294. In some embodiments, the trench portion 249 may also be referred to as bridging portion. The trench portion 249 connects the inductor bonding metallurgies (the inductor bonding pad 192, the bonding via 194, the inductor bonding pad 292, and the bonding via 294) with the via portion 2621. In some embodiments, these bonding metallurgies (the inductor bonding pad 192, the bonding via 194, the inductor bonding pad 292, and the bonding via 294) may be considered as a bonding portion 1050 of the inductor IND1. In some embodiments, the bonding portion 1050 of the inductor IND1 extends across the bonding interface BI between different semiconductor dies 100 and 200.

In some embodiments, the inductor via portion 2621 establishes electrical contact between one end of the trench portion 264 and the bonding via 249 at the contact area CT2621. At the other end of the trench portion 264, the via portion 2622 establishes electrical connection with one end of the trench portion 248 at the contact area CT2622. The trench portion 264 and the trench portion 248 may be respectively considered as the coil 6040 and the coil 6050 of the inductor IND1. At the other end of the trench portion 248, the via portion 246 establishes electrical connection with the trench portion 244 at the contact area CT246. In some embodiments, the trench portion 244 may be referred to as the coil 6060 of the inductor IND1. In some embodiments, the trench portion 244 may be connected to the devices D2 by an inductor via (not shown) or to the trench portions 234 (shown in FIG. 3J). As mentioned above, the material of some of the winding portions 1010 to 1050 may be different. For example, at the contact areas CT2621 and CT2622 where the via portions 2621, 2622 contact the inductor patterns 240, an interface between different conductive materials may be visible. In some embodiments, using different materials for these several coils of the inductor IND1 allows fine tuning of the properties (e.g., inductance, resistivity, etc.) of the inductor IND1. Furthermore, by incorporating a bonding portion 1050 extending across the bonding interface BI of the semiconductor dies 100, 200 to connect the winding portions 1010 to 1040, thinner winding portions may be fabricated. As a result, the planarity of the overlying layers may be improved and the reliability of the semiconductor package may be enhanced.

Referring to FIG. 4B, the inductor IND1 may be integrated within larger circuits (not shown). During operation of the semiconductor package 10, an electric current may enter the inductor IND1 from one extremity (e.g., the trench portion 244 or the trench portion 144) and may run through the coils 6010 to 6050 to exit from the other extremity (e.g., the other one of the trench portion 244 or the trench portion 144). For example, depending on the configuration of the larger circuit and the applied voltage, an electrical current may enter the inductor from the trench portion 144, as indicated by the arrow C_In in FIG. 4B. The current may then run through the coil 6010 in a counterclockwise direction to enter the coil 6020 through the via portion 146. Subsequently, the current runs through the coil 6020 in a counterclockwise direction to enter the coil 6060 through the via portion 1621. Then, the current runs through the coil 6060 in a counterclockwise direction to enter the trench portion 149 via the via portion 1622. Thereafter, the current runs through the bonding portion 1050 (through the bonding via 194, the bonding pad 192, the bonding pad 292, and the bonding via 294 in sequential order) to enter the trench portion 249. Afterward, the current enters the coil 6040 via the via portion 2621 and runs through the coil 6040 in a counterclockwise direction. Subsequently, the current enters the coil 6050 through the via portion 2622 and runs through the coil 6050 in a counterclockwise direction to enter the coil 6060 through the via portion 246. Lastly, the current leaves the inductor IND1 at the end of the coil 6060, as indicated by arrow C_Out in FIG. 4B. That is, the six coils 6010 to 6060 of the inductor IND1 may be connected in series, with the bonding portion 1050 interposed between the coil 6060 and the coil 6040.

Figure 5:
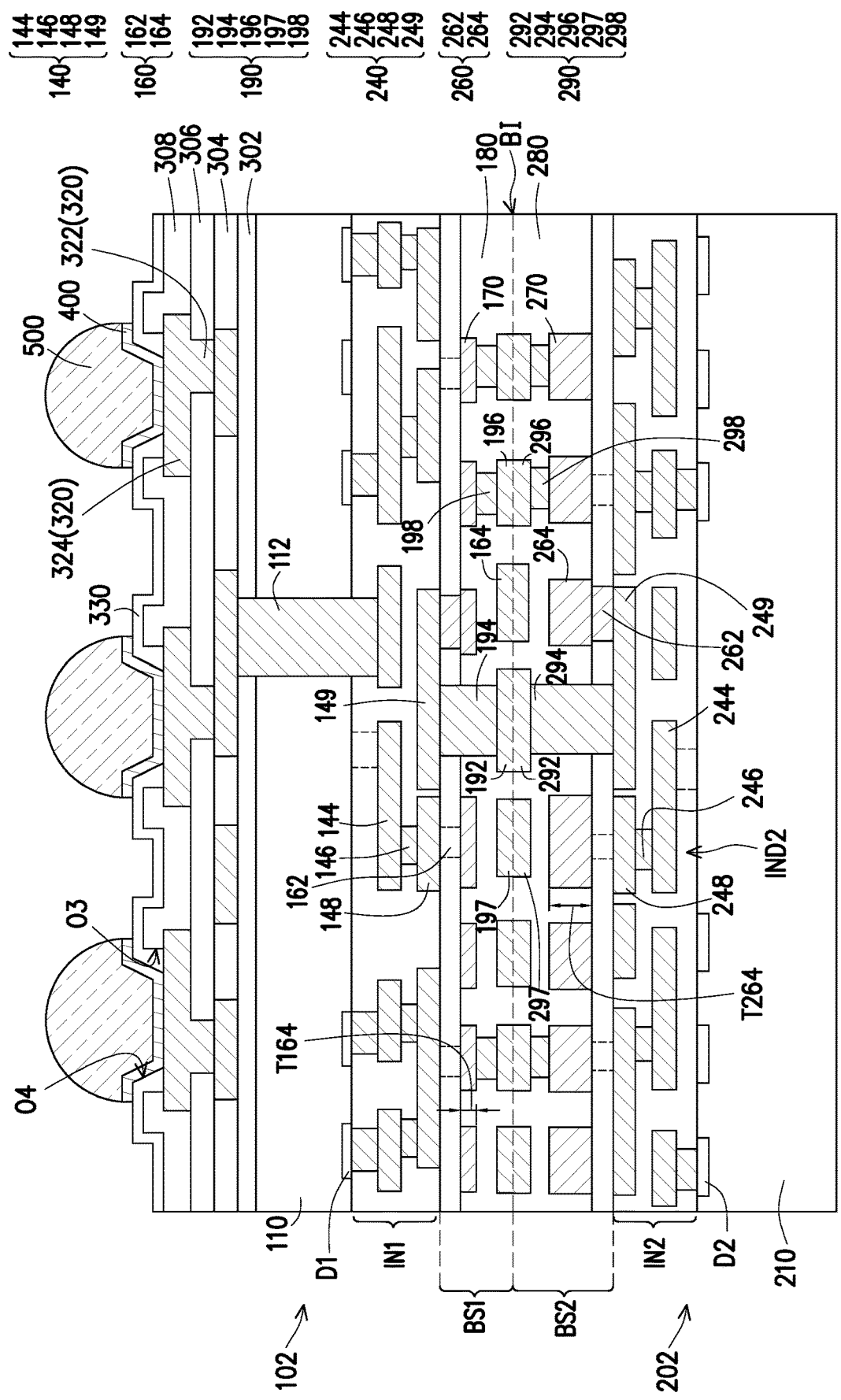
FIG. 5 is a schematic cross-sectional view of a semiconductor package according to some alternative embodiments of the disclosure.

FIG. 5 is a schematic cross-sectional view of a semiconductor package 20 according to some alternative embodiments of the disclosure. The semiconductor package 20 may be similar to the semiconductor package 10 of FIG. 3J, so similar elements are denoted by the same or similar reference numerals and the detailed description thereof is omitted herein. In the semiconductor package 20, a semiconductor die 202 is used in place of the semiconductor die 200, resulting in the formation of an inductor IND2 upon bonding with the semiconductor die 102. A difference between the semiconductor die 202 and the semiconductor die 200 (and between the inductor IND2 and the inductor IND1) lies in the thickness T264 of the trench portion 264 of the inductor patterns 260. As illustrated in FIG. 5, the trench portion 264 is thicker than the trench portion 164 of the semiconductor die 102. In some embodiment, the thickness T264 of the trench portion 264 may be up to 2 times the thickness T164 of the trench portion T164. However, the disclosure is not limited thereto. In some alternative embodiments, the trench portion 164 may be thicker than the trench portion 264. For example, the thickness T164 of the trench portion 164 may be up to 5 times the thickness T264 of the trench portion T264.

Figure 6A:
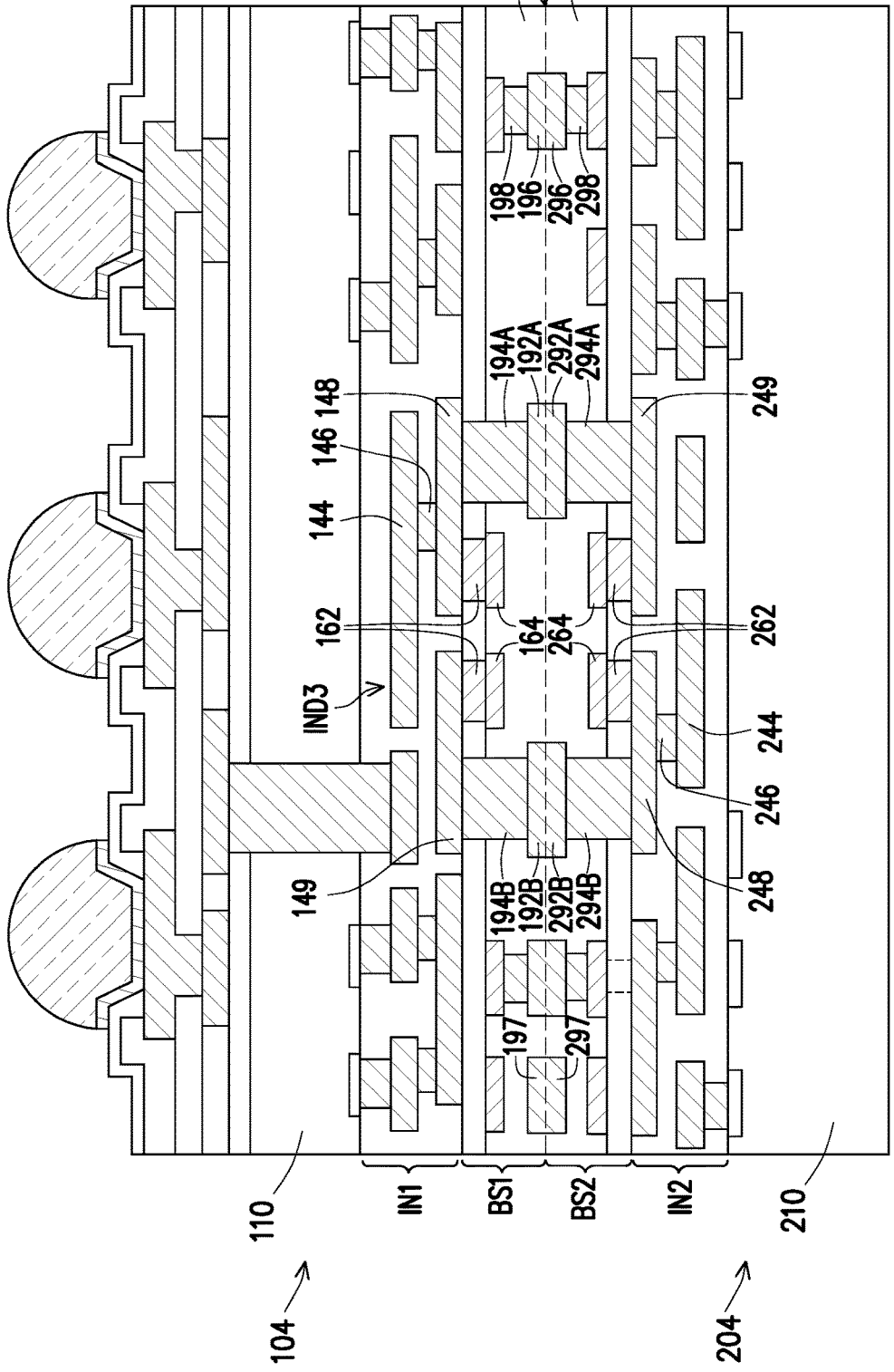
FIG. 6A is a schematic cross-sectional view of a semiconductor package according to some alternative embodiments of the disclosure.
Figure 6B:
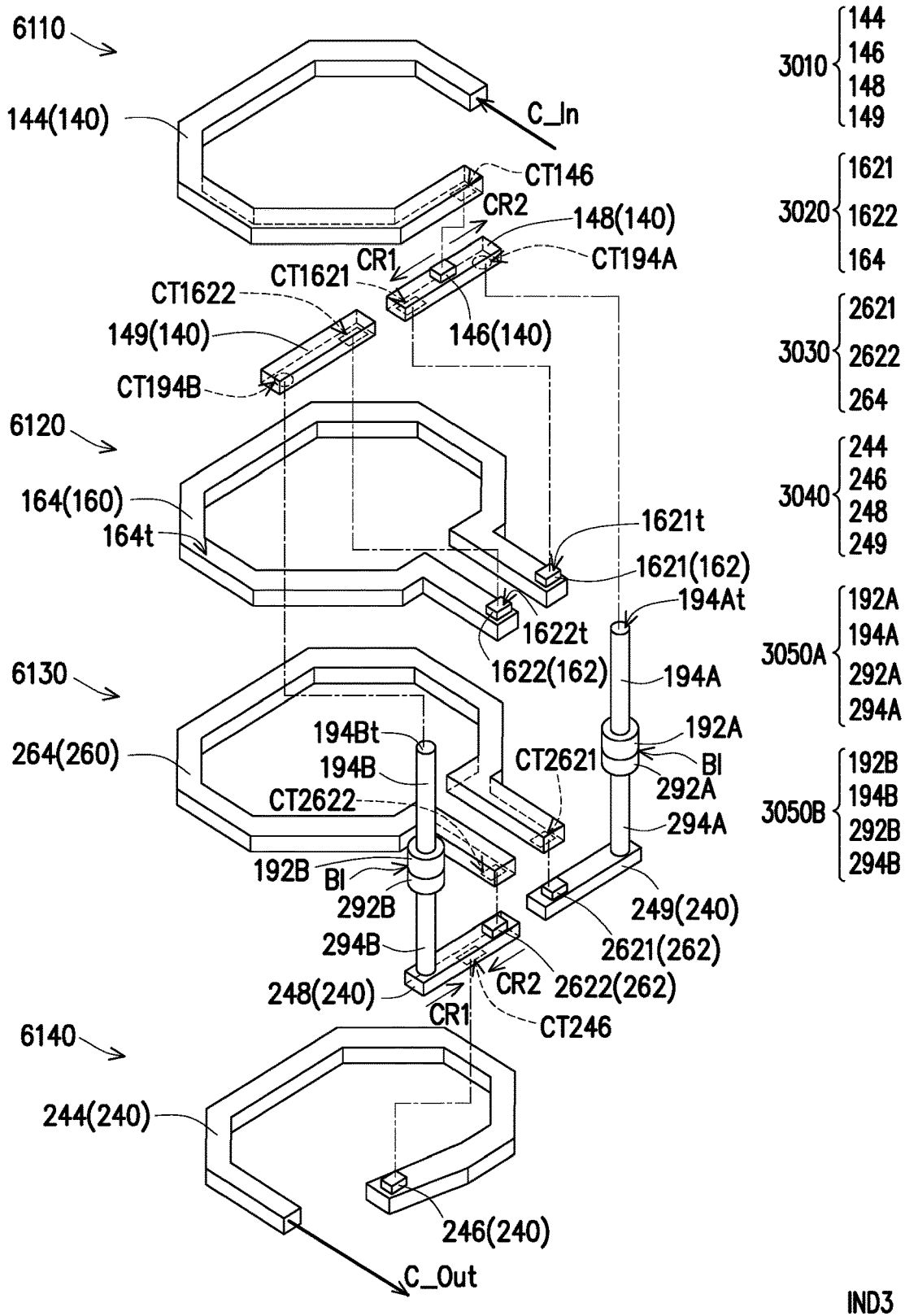
FIG. 6B is a schematic exploded view of an inductor of the semiconductor package in FIG. 6A.

FIG. 6A is a schematic cross-sectional view of a semiconductor package 30 according to some alternative embodiments of the disclosure. FIG. 6B is a schematic exploded view of an inductor IND3 of a semiconductor package 30 according to some alternative embodiments of the disclosure. The conductive wire in the inductor IND3 included in the semiconductor package 30 is illustrated in FIG. 6B. The semiconductor package 30 and the inductor IND3 may be respectively similar to the semiconductor package 10 and the inductor IND1 of FIG. 3J and FIG. 4B, so similar elements are denoted by the same or similar reference numerals and the detailed description thereof is omitted herein. Referring to FIG. 6A and FIG. 6B, the difference between the semiconductor package 30 and the semiconductor package 10 is that the inductor IND3 includes fewer coils than that of the inductor IND1. Furthermore, some of the coils of the inductor IND3 may be connected in parallel, rather than in series. For example, the coil 6120 and the coil 6130 may be connected in parallel. In some embodiments, the inductor IND3 include a winding portion 3010, a second winding portion 3020, a winding portion 3030, a winding portion 3040, a first bonding portion 3050A, and a second bonding portion 3050B. The winding portion 3010 includes the trench portion 144 (the coil 6110), the via portion 146, the trench portion 148, and the trench portion 149. The winding portion 3020 includes the trench portion 164 (the coil 6120) and the via portions 1621, 1622. The winding portion 3030 includes the trench portion 264 (the coil 6130) and the via portions 2621, 2622. The winding portion 3040 includes the trench portion 244 (the coil 6140), the trench portion 248, the trench portion 249 and the via portion 246. The first bonding portion 3050A includes a first part of the bonding metallurgies (the bonding pad 192A, the bonding via 194A, the bonding pad 292A, and the bonding via 294A). The second bonding portion 3050B includes the remaining bonding metallurgies (the bonding pad 192B, the bonding via 194B, the bonding pad 292B, and the bonding via 294B). In some embodiments, the trench portions 148, 149, 248 and 249 are part of the inductor IND3 without forming a coil of the inductor IND3. Rather, the trench portions 148, 149, 248, and 249 may act as connectors between different portions of the inductor IND3. For example, the winding portion 3010 is connected to both of the winding portion 3020 and the first bonding portion 3050A through the trench portion 148 and to both of the winding portion 3020 and the second bonding portion 3050B through the trench portion 149. That is, the trench portion 148 may be in direct contact with both of the bonding via 194A of the first bonding portion 3050A at the contact area CT194A and the via portion 1621 of the winding portion 3020 at the contact area CT1612, and the trench portion 149 may be in direct contact with both of the bonding via 194B of the second bonding portion 3050B at the contact area CT194B and the via portion 1622 of the winding portion 3020 at the contact area CT1622. Similarly, the winding portion 3040 is connected to both of the winding portion 3030 and the second bonding portion 3050B via the trench portion 248 and to both of the winding portion 3030 and the second bonding portion 3050B via the trench portion 249. That is, the trench portion 248 may be in direct contact with both of the bonding via 294B of the second bonding portion 3050B and the via portion 2622 of the winding portion 3030, and the trench portion 249 may be in direct contact with both of the bonding via 249A of the first bonding portion 3050A and the via portion 2621 of the winding portion 3030. On the other hand, the via portion 2621 is in direct contact with the trench portion 264 at the contact area CT2621 and the via portion 2622 is in direct contact with the trench portion 254 at the contact area CT2622. The winding portion 3010 may be connected to the winding portion 3030 through the first bonding portion 3050A and the winding portion 3020 may be connected to the winding portion 3040 through the second bonding portion 3050B. In some embodiments, the trench portion 164 (the coil 6120) and the trench portion 264 (the coil 6130) are electrically connected in parallel through the bonding via 194A, the bonding pad 192A, the bonding pad 292A, and the bonding pad 294A on a first side, and through the bonding via 194B, the bonding pad 192B, the bonding pad 292B, and the bonding pad 294B on a second side.

During operation of the semiconductor package 30, an electric current may enter the inductor IND3 from one extremity (e.g., the trench portion 244 or the trench portion 144) and may run through the coils 6110 to 6140 to exit from the other extremity (e.g., the other one of the trench portion 244 and the trench portion 144). For example, an electrical current may enter the inductor from the trench portion 144, as indicated by the arrow C_In in FIG. 6B. The current may then run through the coil 6110 (the trench portion 144) of the inductor IND3 in a counterclockwise direction to enter the trench portion 148 through the via portion 146. In the trench portion 148, the current C1 may split into a first current CR1 and a second current CR2. The first current CR1 may enter the coil 6120 (the trench portion 164) through the via portion 1621 and runs through the coil 6120 in a counterclockwise direction. The first current CR1 then enters the trench portion 149 through the via portion 1622 and runs through the second bonding portion 3050B (through the bonding via 194B, the bonding pad 192B, the bonding pad 292B, and the bonding via 294B in sequential order) to reach the trench portion 248 from the bonding via 294B. The second current CR2 may run through the first bonding portion 3050A (through the bonding via 194A, the bonding pad 192A, the bonding pad 292A, and the bonding via 294A in sequential order) to enter the trench portion 249. Then, the second current CR2 enters the coil 6130 (the trench portion 264) through the via portion 2621 and runs through the coil 6130 in a counterclockwise direction to reach the trench portion 248 through the via portion 2622. In the trench portion 248, the first current CR1 and the second current CR2 may recombine and further proceed toward the coil 6140 (the trench portion 244), which they enter through the via portion 246. After running through the coil 6140 in a counterclockwise direction, the current may leave the inductor IND3 at the end of the coil 6140, as indicated by arrow C_Out in FIG. 6B. In some embodiments, by having the coil 6120 and the coil 6130 connected in parallel, the resistance of the inductor IND3 may be lowered.

Figure 7A:
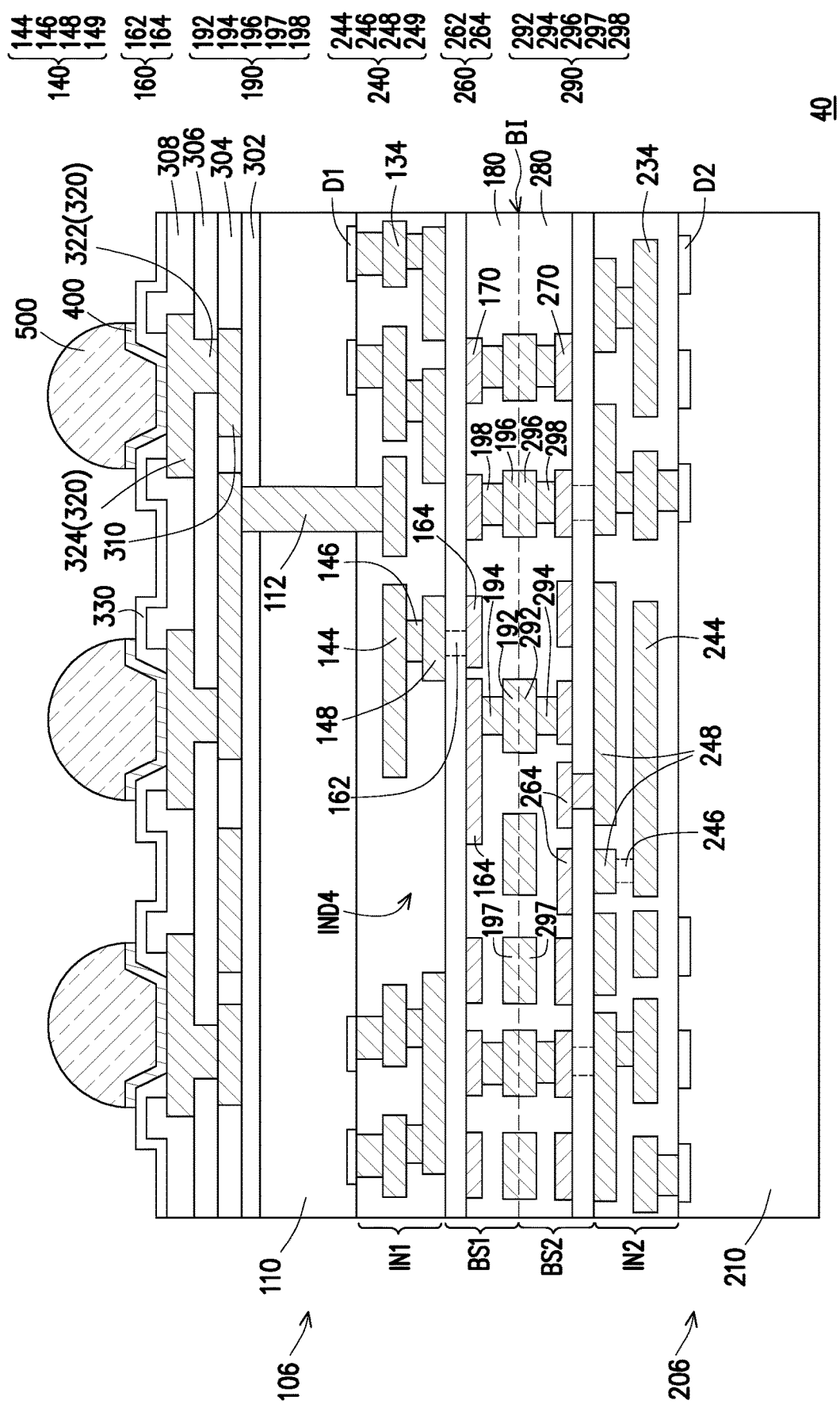
FIG. 7A is a schematic cross-sectional view of a semiconductor package according to some alternative embodiments of the disclosure.
Figure 7B:
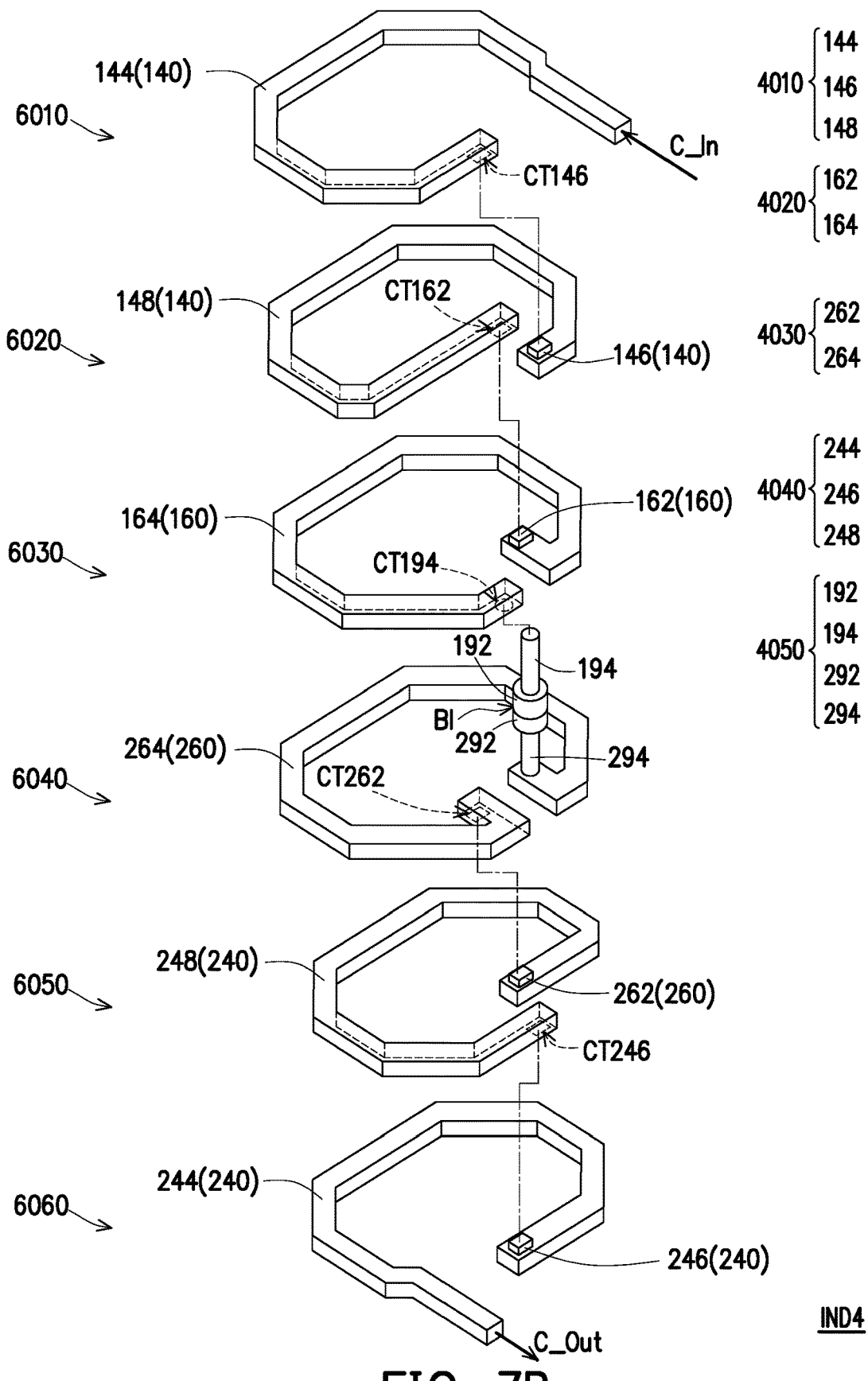
FIG. 7B is a schematic exploded view of an inductor of the semiconductor package in FIG. 7A.

FIG. 7A is a schematic cross-sectional view of a semiconductor package 40 according to some alternative embodiments of the disclosure. FIG. 7B is a schematic exploded view of an inductor IND4 of a semiconductor package 40 according to some embodiments of the disclosure. The conductive wire in the inductor IND4 included in the semiconductor package 40 is illustrated in FIG. 7B. The semiconductor package 40 and the inductor IND4 may be respectively similar to the semiconductor package 10 and the inductor IND 1 of FIG. 3J and FIG. 4B, so similar elements are denoted by the same or similar reference numerals and the detailed description thereof is omitted herein. Referring simultaneously to FIG. 7A and FIG. 7B, the difference between the semiconductor package 40 and the semiconductor package 10 is that that the inductor IND4 does not include bridging portions (i.e. the trench portions 149, 249 shown in FIG. 4B). That is, the coil 6030 (the trench portion 164) of the winding portion 4020 is directly in contact with the bonding via 194 while the coil 6040 (the trench portion 264) of the winding portion 4030 is directly in contact with the bonding via 294. In some embodiments, having the coils within the inductor to directly contact the bonding metallurgies (without intervening bridging portions) may improve the route ability as well as reduce the layout area penalty in the metallization layer of the interconnection structures.

Figure 8A:
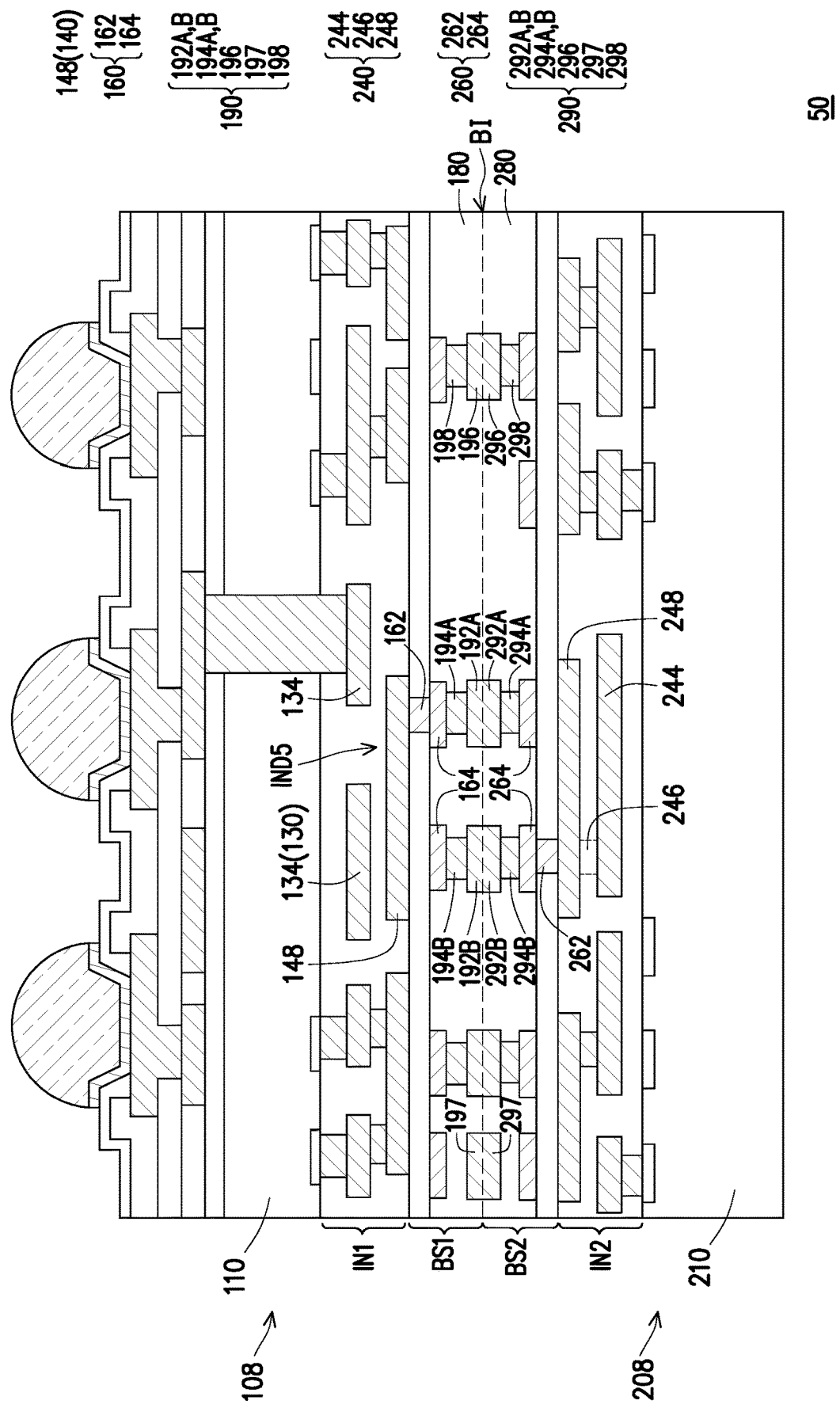
FIG. 8A is a schematic cross-sectional view of a semiconductor package according to some alternative embodiments of the disclosure.
Figure 8B:
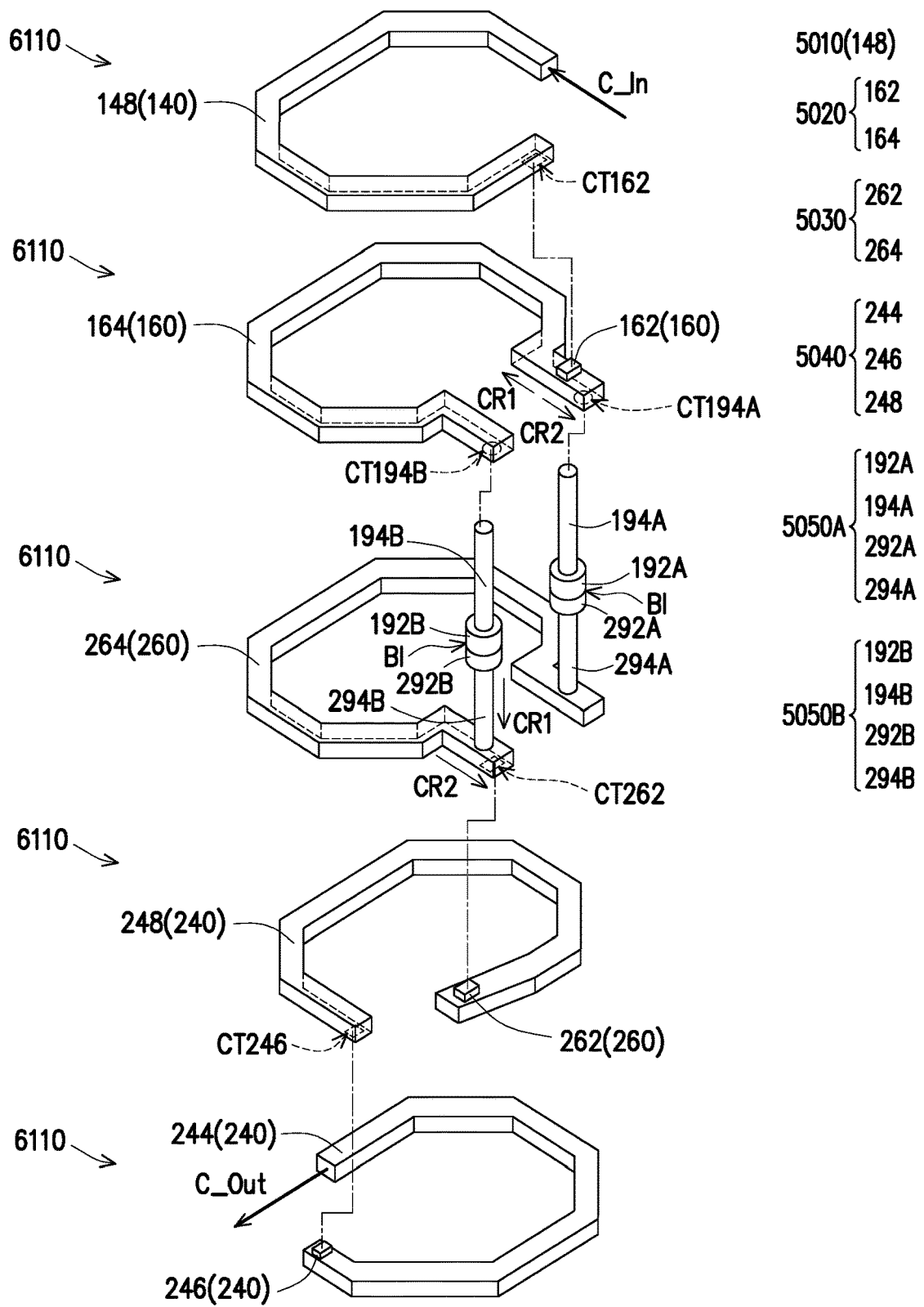
FIG. 8B is a schematic exploded view of an inductor of the semiconductor package in FIG. 8A.

FIG. 8A is a schematic cross-sectional view of a semiconductor package 50 according to some alternative embodiments of the disclosure. FIG. 8B is a schematic exploded view of an inductor IND5 of a semiconductor package 50 according to some alternative embodiments of the disclosure. The conductive wire in the inductor IND5 included in the semiconductor package 50 is illustrated in FIG. 8B. The semiconductor package 50 and the inductor IND5 may be respectively similar to the semiconductor package 30 and the inductor IND3 of FIG. 6A and FIG. 6B, so similar elements are denoted by the same or similar reference numerals and the detailed description thereof is omitted herein. Referring to FIG. 8A and FIG. 8B, the difference between the semiconductor package 50 and the semiconductor package 30 is that the inductor IND5 further includes coil 6150. Another difference is that the inductor IND5 does not include bridging portions (i.e. the trench portions 148, 149, 248, and 249 shown in FIG. 6B). That is, the coil 6120 (the trench portion 164) of the winding portion 5020 is directly in contact with the bonding vias 194A, 194B while the coil 6130 (the trench portion 264) of the winding portion 5030 is directly in contact with the bonding vias 294A, 294B.

In some embodiments, the winding portion 5010 includes the trench portion 148 (the coil 6110). The winding portion 5020 includes the trench portion 164 (the coil 6120) and the via portion 162. The winding portion 5030 includes the trench portion 264 (the coil 6130) and the via portion 262. The winding portion 5040 includes the trench portion 248 (the coil 6140), the trench portion 244 (the coil 6150) and the via portion 246. The first bonding portion 5050A includes a first part of the bonding metallurgies (the bonding pad 192A, the bonding via 194A, the bonding pad 292A, and the bonding via 294A). The second bonding portion 5050B includes the remaining bonding metallurgies (the bonding pad 192B, the bonding via 194B, the bonding pad 292B, and the bonding via 294B). In some embodiments, the winding portion 5010 is directly connected to the winding portion 5020 through the via portion 162 at the contact area CT162. The winding portion 5020 is connected to the first bonding portion 5050A at the contact area CT194A and the second bonding portion 5050B at the contact area CT194B. That is, one end of the coil 6120 is connected to the first bonding portion 5050A and the other end of the coil 6120 is connected to the second bonding portion 5050B. The first bonding portion 5050A and the second bonding portion 5050B are sandwiched between corresponding ends of the coil 6120 and the coil 6130. The coil 6140 is connected to the coil 6130 through the via portion 262 at the contact area CT262. The coil 6150 is connected to the coil 6140 through the via portion 246 at the contact area CT246.

During operation of the semiconductor package 50, an electric current may enter the inductor IND5 from one extremity (e.g., the trench portion 244 or the trench portion 148) and may run through the coils 6110 to 6150 to exit from the other extremity (e.g., the other one of the trench portion 244 and the trench portion 148). For example, an electrical current may enter the inductor from the trench portion 148, as indicated by the arrow C_In in FIG. 8B. The current may then run through the coil 6110 (the trench portion 148) of the inductor IND5 in a counterclockwise direction to enter the coil 6120 (the trench portion 164) through the via portion 162. Upon entering the coil 6120, the current C1 may split into a first current CR1 and a second current CR2. The first current CR1 may run through the coil 6120 in a counterclockwise direction and may run through the second bonding portion 5050B (through the bonding via 194B, the bonding pad 192B, the bonding pad 292B, and the bonding via 294B in sequential order) to reach an end of the coil 6130 (the trench portion 264) where the via portion 262 is located. The second current CR2 may run through the first bonding portion 5050A (through the bonding via 194A, the bonding pad 192A, the bonding pad 292A, and the bonding via 294A in sequential order) to enter the coil 6130. Thereafter, the second current CR2 runs through the coil 6130 in a counterclockwise direction to reach the same end where the first current CR1 enter the coil 6130. Subsequently, the first current CR1 and the second current CR2 may recombine and further proceed toward the coil 6140 (the trench portion 248), which they enter through the via portion 262. Then, the current runs through the coil 6140 in a counterclockwise direction and enters the coil 6150 (the trench portion 244) through the via portion 246. Lastly, the current runs through the coil 6150 in a counterclockwise direction and leaves the inductor IND5 at the end of the coil 6150, as indicated by arrow C_Out in FIG. 8B. In some embodiments, by having the coil 6120 and the coil 6130 connected in parallel, the resistance of the inductor IND5 may be lowered.

In accordance with some embodiments of the disclosure, a semiconductor package includes a first die and a second die. The first die includes a first spiral section and first bonding metallurgies of an inductor. The first bonding metallurgies are connected to the first spiral section. The second die is bonded to the first die. The second die includes a second spiral section and second bonding metallurgies of the inductor. The second bonding metallurgies are connected to the second spiral section. The inductor extends from the first die to the second die.

In accordance with some embodiments of the disclosure, a semiconductor package includes a first die, a second die, and an inductor. The first die includes a first semiconductor substrate, a first interconnection structure, and a first bonding structure. The first interconnection structure is disposed on the first semiconductor substrate. The first bonding structure is disposed over the first interconnection structure. The second die includes a second semiconductor substrate, a second interconnection structure, and a second bonding structure. The second interconnection structure is disposed on the second semiconductor substrate. The second bonding structure is disposed over the second interconnection structure. The first bonding structure is physically in contact with the second bonding structure. The inductor includes a first winding portion, a second winding portion, a third winding portion, and a fourth winding portion connected to each other. The first winding portion is embedded in the first interconnection structure, the second winding portion is embedded in the first bonding structure, the third winding portion is embedded in the second bonding structure, and the fourth winding portion is embedded in the second interconnection structure.

In accordance with some embodiments of the disclosure, a manufacturing method of a semiconductor package includes at least the following steps. A first die is provided. Providing the first die includes at least the following steps. A first semiconductor substrate having a first interconnection structure formed thereon is provided. A first coil of an inductor is formed in the first interconnection structure. A second coil of the inductor is formed over the first interconnection structure. The second coil is electrically connected to the first coil. A first inductor bonding via and a first inductor bonding pad are formed over the first interconnection structure. The first inductor bonding via and the first inductor bonding pad are electrically connected to the first coil and the second coil. A second die is provided. The second die has a third coil of the inductor, a second bonding via, and a second inductor bonding pad. The second bonding via and the second inductor bonding pad are connected to the third coil. The inductor is formed by bonding the first inductor bonding pad to the second inductor bonding pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first die, comprising a first coil and a second coil of an inductor, wherein the first coil and the second coil are located at different level heights, the first coil includes a first metallic material, the second coil includes a second metallic material, and the first metallic material has a different composition from the second metallic material; and a second die bonded to the first die, comprising a third coil of the inductor, wherein the inductor extends from the first die to the second die.

2. The semiconductor package of claim 1, wherein the first die further comprises first bonding metallurgies connected to the second coil, the second die comprises second bonded metallurgies connected to the third coil, and the first bonding metallurgies directly contact the second bonding metallurgies.

3. The semiconductor package of claim 2, wherein the first die further comprises a bridging portion disposed at a same level height as the first coil, wherein the second coil, the bridging portion, and the first bonding metallurgies are serially connected and the bridging portion comprises the first metallic material.

4. The semiconductor package of claim 1, wherein the third coil and the second coil are connected in parallel to the first coil.

5. The semiconductor package of claim 4, wherein the third coil comprises the second metallic material.

6. The semiconductor package of claim 1, wherein the first die further comprises:
a protective layer, wherein the protective layer extends between the first coil and the second coil and directly contacts the first coil at one side and the second coil at an opposite side; and
a via portion, wherein the via portion extends through the protective layer to electrically connect the first coil to the second coil.

7. The semiconductor package of claim 6, wherein the via portion includes the second metallic material and directly contacts the first coil.

8. A semiconductor package, comprising a first die and a second die, wherein the first die comprises:
a first conductive pattern shaped as an open loop;
a protective layer, disposed on the first conductive pattern;
a second conductive pattern shaped as an open loop, disposed on the protective layer at an opposite side of the first conductive pattern, and connected to one end of the first conductive pattern;
first conductive pads, disposed on the protective layer and are coplanar to the second conductive pattern;
a first bonding dielectric layer, extending on and directly in contact with the second conductive pattern, the first conductive pads, and the protective layer; and
first bonding pads, entrenched in the first bonding dielectric layer and levelled with a front surface of the first bonding dielectric layer;
wherein the second die comprises:
a third conductive pattern, shaped as an open loop;
a second bonding dielectric layer, extending on the third conductive pattern; and
second bonding pads, entrenched in the second bonding dielectric layer and levelled with a front surface of the second bonding dielectric layer;
wherein the front surface of the first bonding dielectric layer directly contacts the front surface of the second bonding dielectric layer, the first bonding pads directly contact the second bonding pads, and the first bonding pads and the second bonding pads connect the second conductive pattern to the third conductive pattern to form a spiraling conductive wire of an inductor comprising the first conductive pattern, the second conductive pattern, and the third conductive pattern.

9. The semiconductor package of claim 8, wherein the protective layer directly contacts a first metal on one side, and a second metal different from the first metal at an opposite side.

10. The semiconductor package of claim 9, wherein the first conductive pads comprise the second metal.

11. The semiconductor package of claim 8, wherein the first die further comprises:
a fourth conductive pattern, formed on a same side of the protective layer as the first conductive pattern; and
a bonding via directly contacting at least one of the first bonding pad at one end and extending through the protective layer to directly contact the fourth conductive pattern at an opposite end.

12. The semiconductor package of claim 8, wherein a thickness of the third conductive pattern in a stacking direction of the second conductive pattern and the third conductive pattern is greater than a thickness of the second conductive pattern in the stacking direction of the second conductive pattern and the third conductive pattern.

13. The semiconductor package of claim 8, wherein a pair of the first bonding pads and a pair of the second bonding pads connect the second conductive pattern to the third conductive pattern;
the first die further comprises a pair of first bonding vias connecting each end of the second conductive pattern to a respective first bonding pad of the pair of first bonding pads; and
the second die further comprises a pair of second bonding vias connecting each end of the third conductive pattern to a respective second bonding pad of the pair of second bonding pads.

14. The semiconductor package of claim 8, wherein the first die further comprises:
a semiconductor substrate disposed over the first conductive pattern opposite to the protective layer; and
a through semiconductor via penetrating through the semiconductor substrate.

15. A manufacturing method of a semiconductor package, comprising:
disposing a first conductive material of a first coil of an inductor in a first interconnection structure, the first interconnection structure overlying a first semiconductor substrate;
disposing a second conductive material of a second coil of the inductor over the first coil, the second coil being electrically connected to the first coil;
disposing a bonding dielectric material to embed the second coil to form a first bonding dielectric layer;
patterning the bonding dielectric material to form at least one trench opening and at least one via opening;
filling a third conductive material in the at least one trench opening and the at least one via opening to form a first inductor bonding via and a first inductor boding pad in the first bonding dielectric layer; and
bonding the first inductor bonding pad and the first bonding dielectric layer to a second inductor bonding pad and a second bonding dielectric layer, wherein after bonding, the second coil is connected to a third coil of the inductor through the first inductor bonding pad and the second inductor bonding pad.

16. The manufacturing method of claim 15, wherein bonding the first inductor bonding pad to the second inductor bonding pad comprises contacting the first inductor bonding pad to the second inductor bonding pad and performing a thermal annealing process to bond the first inductor bonding pad to the second inductor bonding pad.

17. The manufacturing method of claim 15, further comprising:
disposing a fourth conductive material of the third coil of the inductor on a second interconnection structure, the second interconnection structure overlying a second semiconductor substrate;
disposing a second bonding dielectric material to cover and directly contact the third coil to form the second bonding dielectric layer;
patterning the second bonding dielectric material to form at least one trench opening and at least one via opening; and
filling a fifth conductive material in the at least one trench opening and the at least one via opening of the second bonding dielectric material to form the second inductor bonding via and the second inductor boding pad in the second bonding dielectric layer.

18. The manufacturing method of claim 15, further comprising:
disposing a fourth conductive material to form conductive pads at a same level height as the second conductive material, wherein the bonding dielectric material is disposed so as to embed the conductive pads together with the second coil.

19. The manufacturing method of claim 15, wherein
the first conductive material is disposed in the interconnection structure to form the first coil and a bridging portion at the same level height over the first semiconductor substrate as the first coil,
the second conductive material is disposed so as to form a via portion on the second coil, wherein the via portion connects the bridging portion to the second coil, and,
after the bonding dielectric material is patterned, the via opening exposes a section of the bridging portion.

20. The manufacturing method of claim 15, wherein the first conductive material and the second conductive material have a different composition.

* * * * *